(12) United States Patent
Lu et al.

(10) Patent No.: US 10,233,544 B2
(45) Date of Patent: Mar. 19, 2019

(54) GROWTH OF NITRIDE FILMS

(71) Applicant: Board of Regents of the University of Nebraska, Lincoln, NE (US)

(72) Inventors: Yongfeng Lu, Lincoln, NE (US); Hossein Rabiee Golgir, Lincoln, NE (US); Yunshen Zhou, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 125 days.

(21) Appl. No.: 15/158,305

(22) Filed: May 18, 2016

(65) Prior Publication Data

US 2016/0340783 A1 Nov. 24, 2016

Related U.S. Application Data

(60) Provisional application No. 62/163,663, filed on May 19, 2015.

(51) Int. Cl.
| | | |
|---|---|---|
| *C23C 16/34* | (2006.01) | |
| *C22C 11/06* | (2006.01) | |
| *C22C 13/00* | (2006.01) | |
| *C23C 16/48* | (2006.01) | |
| *H01L 21/02* | (2006.01) | |
| *H01L 29/20* | (2006.01) | |
| *C23C 16/30* | (2006.01) | |

(52) U.S. Cl.
CPC ............ *C23C 16/483* (2013.01); *C22C 11/06* (2013.01); *C22C 13/00* (2013.01); *C23C 16/303* (2013.01); *C23C 16/34* (2013.01); *H01L 21/0242* (2013.01); *H01L 21/0254* (2013.01); *H01L 21/0262* (2013.01); *H01L 21/02425* (2013.01); *H01L 29/2003* (2013.01); *H01L 21/02378* (2013.01); *H01L 21/02381* (2013.01); *H01L 21/02422* (2013.01)

(58) Field of Classification Search
CPC ....... C23C 16/34; C23C 16/303; C22C 11/06; C22C 13/00; H01L 21/0254; H01L 21/0262; H01L 21/0242; H01L 21/02425; H01L 21/02422; H01L 21/02381; H01L 21/02378; H01L 29/2003
USPC ......................................................... 428/698
See application file for complete search history.

(56) References Cited

U.S. PATENT DOCUMENTS

2016/0203972 A1* 7/2016 Sundaram ............ H01L 21/268
257/76

OTHER PUBLICATIONS

Bhuiyan et al., "Indium nitride (InN): A review on growth, characterization, and properties," Journal of Applied Physics, 2003, 94(5): 2779-2808.

(Continued)

*Primary Examiner* — William K Cheung
(74) *Attorney, Agent, or Firm* — Fish & Richardson P.C.

(57) ABSTRACT

A gallium nitride thin film can be formed on a substrate at a low temperature (e.g., not higher than 600° C.) by applying a laser to resonantly excite molecules of a first precursor that contains nitrogen, in which the laser has a wavelength that is selected to match a vibration mode and/or a vibrational-rotational mode of the molecules of the first precursor. A second precursor is provided in which the excited first precursor and the second precursor react to form a nitride that is deposited on the substrate. For example, the second precursor may include gallium, and the nitride may be gallium nitride. Other nitride films can be produced in a similar manner.

91 Claims, 10 Drawing Sheets

(56) References Cited

OTHER PUBLICATIONS

Elam et al., "Surface chemistry and film growth during TiN atomic layer deposition using TDMAT and $NH_3$," Thin Solid Films, 2003, 436(2): 145-156.
Grandjean et al., "Molecular-beam epitaxy of gallium nitride on (0001) sapphire substrates using ammonia," Journal of Applied Physics, 1998, 83(3): 1379-1383.
Keller and DenBaars, "Metalorganic chemical vapor deposition of group III nitrides—a discussion of critical issues," Journal of Crystal Growth, 2003, 248: 479-486.
Molnar et al., "Growth of gallium nitride by hydride vapor-phase epitaxy," Journal of Crystal Growth, 1997, 178(1): 147-156.
Nagashima et al., "High-speed epitaxial growth of AlN above 1200° C. by hydride vapor phase epitaxy," Journal of Crystal Growth, 2007, 300(1): 42-44.
Ziegler et al., "Relationships between processing, microstructure and properties of dense and reaction-bonded silicon nitride," Journal of Materials Science, 1987, 22(9): 3041-3086.

\* cited by examiner

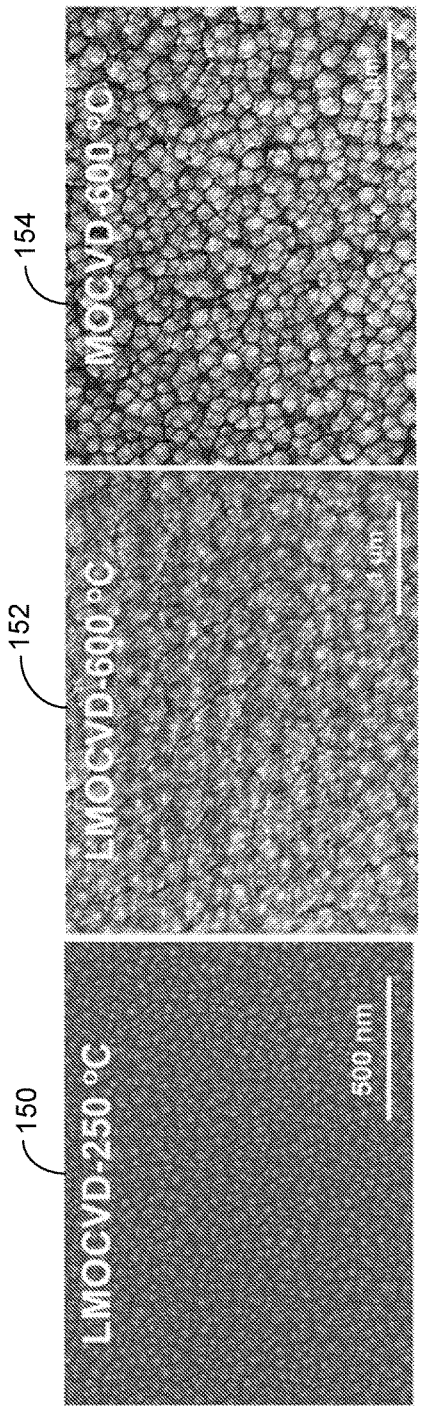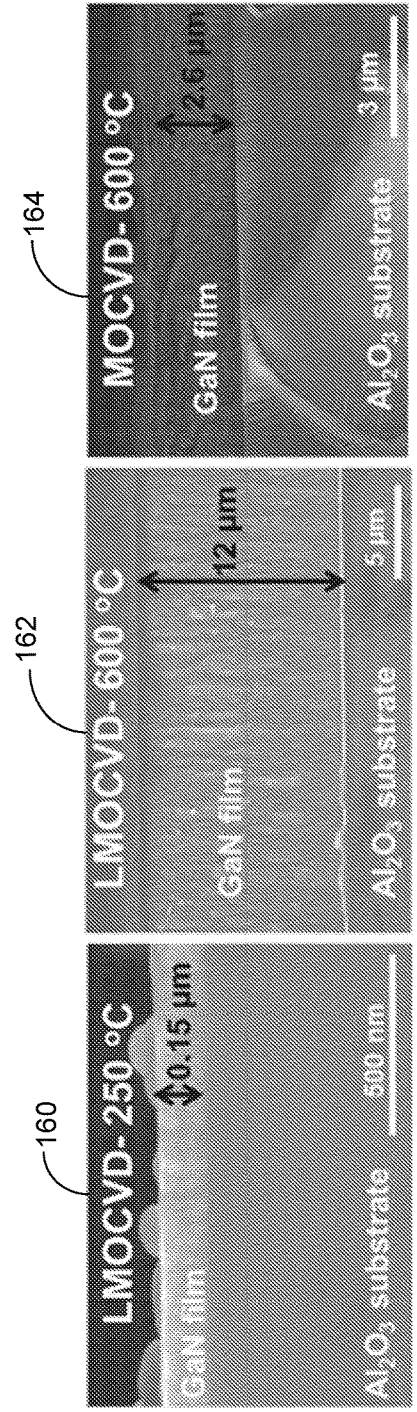

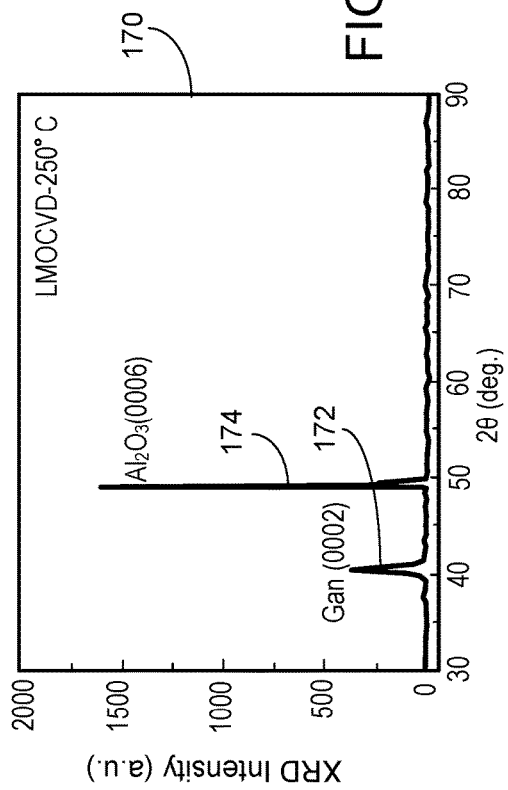
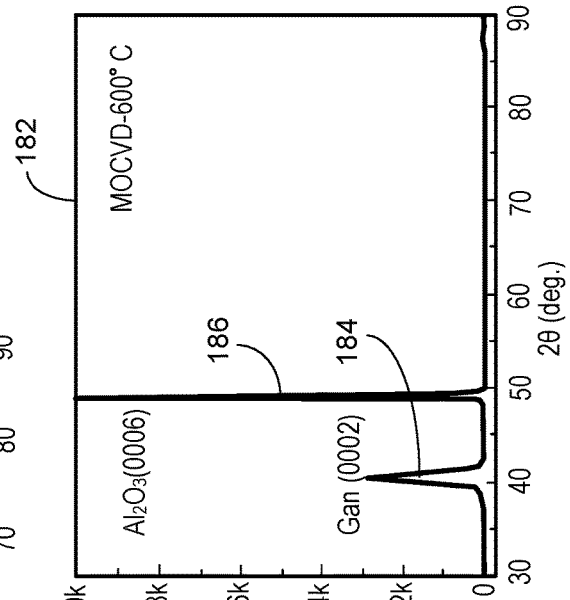
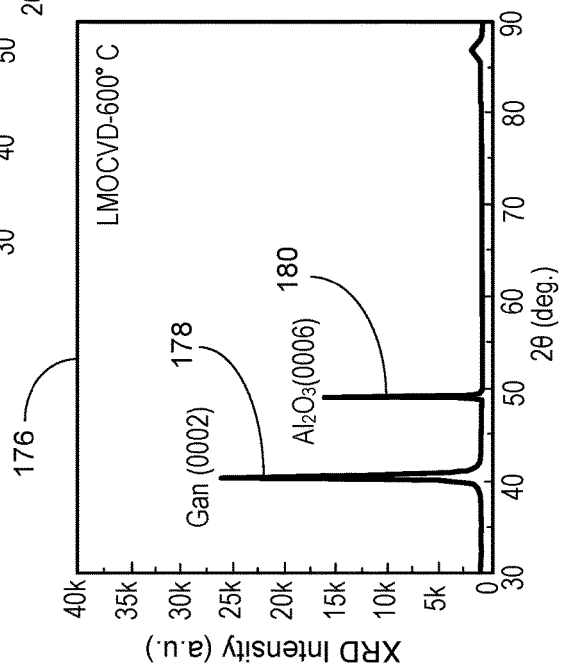
FIG. 6A
FIG. 6B
FIG. 6C

GROWTH OF NITRIDE FILMS

CROSS-REFERENCE TO RELATED APPLICATION

This application claims priority to U.S. provisional patent application 62/163,663, filed on May 19, 2015, which is herein incorporated by reference in its entirety.

STATEMENT AS TO FEDERALLY SPONSORED RESEARCH

This invention was made with government support under Grant No. NSF CMMI 1068510 awarded by the National Science Foundation. The government has certain rights in the invention.

TECHNICAL FIELD

This subject matter is generally related to growth of nitride films.

BACKGROUND

Gallium nitride (GaN) is suitable for a broad range of applications. For example, due to its direct wide bandgap, Gallium nitride is a good material for artificial lighting and optoelectronics, including multi-color light-emission diodes (LEDs) from red to ultraviolet and violet diode lasers used in Blu-ray players. Gallium nitride may have other advantages, including high dielectric strength, high operating temperature, high current density, high speed switching, and low on-resistance. These features make gallium nitride useful in high voltage and high power electronics, such as electrical vehicles, solar panels, wind turbines, smart grids, and switch mode power supplies. High electron mobility enables applications of gallium nitride-based high-electron-mobility transistors (HEMTs) in wireless infrastructure, high-frequency communication systems, active electronically scanned array radars, and aerospace systems.

Conventional synthetic techniques for growing gallium nitride films include metal organic chemical vapor deposition (MOCVD), molecular beam epitaxy (MBE), and hydride vapor phase epitaxy (HVPE). In general, a high substrate temperature, from 750 to 1100° C., is needed to achieve efficient decomposition of precursor materials to provide sufficient nitrogen supply and promote atom surface diffusion.

SUMMARY

In general, in one aspect, a method for fabricating a nitride layer on a substrate is provided. The method includes applying a first laser to resonantly excite molecules of a first precursor to produce at least one of nitrogen or nitrogen-associated species; providing a second precursor having a component that reacts with at least one of the nitrogen or the nitrogen-associated species to form a nitride; and depositing the nitride on a substrate.

Implementations of the method can include one or more of the following features. The first laser can have a wavelength that is selected to match a vibrational mode and/or a vibrational-rotational mode of the molecules of the first precursor. The nitrogen-associated species can include at least one of N, NH, or $NH_2$. In some examples, the method can include causing the excited first precursor to react with the second precursor, and maintaining the substrate at a temperature not more than 600° C., in which the substrate is not subjected to more than 600° C. during deposition of the nitride. In some examples, the method can include causing the excited first precursor to react with the second precursor, and maintaining the substrate at approximately 250° C., in which the substrate is subjected no more than 260° C. during deposition of the nitride. In some examples, the method can include causing the excited first precursor to react with the second precursor, and maintaining the substrate at a temperature in a range from 250 to 300° C., in which the substrate is subjected no more than 300° C. during deposition of the nitride. In some examples, the method can include causing the excited first precursor to react with the second precursor, and maintaining the substrate at a temperature in a range from 300 to 350° C., in which the substrate is subjected no more than 350° C. during deposition of the nitride. In some examples, the method can include causing the excited first precursor to react with the second precursor, and maintaining the substrate at a temperature in a range from 350 to 400° C., in which the substrate is subjected no more than 400° C. during deposition of the nitride. In some examples, the method can include causing the excited first precursor to react with the second precursor, and maintaining the substrate at a temperature in a range from 400 to 450° C., in which the substrate is subjected no more than 450° C. during deposition of the nitride. In some examples, the method can include causing the excited first precursor to react with the second precursor, and maintaining the substrate at a temperature in a range from 450 to 500° C., in which the substrate is subjected no more than 500° C. during deposition of the nitride. In some examples, the method can include causing the excited first precursor to react with the second precursor, and maintaining the substrate at a temperature in a range from 500 to 550° C., in which the substrate is subjected no more than 550° C. during deposition of the nitride. In some examples, the method can include causing the excited first precursor to react with the second precursor, and maintaining the substrate at a temperature in a range from 550 to 600° C., in which the substrate is subjected no more than 600° C. during deposition of the nitride.

Depositing the nitride can include forming a thin film of nitride on the substrate. In some examples, the second precursor can include gallium, and the nitride can include gallium nitride (GaN). In some examples, the second precursor can include trimethylgallium ($(CH_3)_3Ga$). The second precursor can include indium, and the nitride can include indium nitride (InN). In some examples, the second precursor can include providing trimethylindium ($(CH_3)_3In$). In some examples, the second precursor can include aluminum, and the nitride can include aluminum nitride (AlN). In some examples, the second precursor can include trimethylaluminum ($(CH_3)_3Al$). In some examples, the second precursor can include silicon, and the nitride can include silicon nitride ($Si_3N_4$). In some examples, the second precursor can include silane ($SiH_4$). In some examples, the second precursor can include titanium, and the nitride can include titanium nitride (TiN). In some examples, the second precursor can include titanium tetrachloride ($TiCl_4$). In some examples, the second precursor can include carbon, and the nitride can include carbon nitride ($C_3N_4$). In some examples, the second precursor can include hydrocarbons, such as ethylene and/or methane.

The first precursor can include ammonia ($NH_3$). The laser can have a wavelength of 9.219 µm. Applying a laser can include projecting a laser along a path parallel to a surface of the substrate. The distance between the path and the substrate can be, e.g., less than 30 mm or approximately 20 mm. The method can include expanding a laser beam to form a wide laser beam, in which applying a laser can include projecting the wide laser beam along a path parallel to a surface of the substrate. In some examples, depositing the nitride on a substrate can include depositing the nitride on a plastic substrate. In some examples, depositing the nitride on a substrate can include depositing the nitride on a polymer substrate. Depositing the nitride on a substrate can include depositing the nitride on a silicon substrate. Depositing the nitride on a substrate can include depositing the nitride on an aluminum oxide ($Al_2O_3$) substrate. Depositing the nitride on a substrate can include depositing the nitride on a silicon carbide (SiC-4H) substrate. Depositing the nitride on a substrate can include depositing the nitride on a silicon carbide (SiC-6H) substrate. Depositing the nitride on a substrate can include depositing the nitride on a lithium aluminum oxide ($LiAlO_2$) substrate. Depositing the nitride on a substrate can include depositing the nitride on a sapphire substrate. Depositing the nitride on a substrate can include depositing the nitride on a zinc oxide substrate.

The method can include applying a second laser to resonantly excite molecules of a third precursor to produce nitrogen or nitrogen-associated species, in which the second laser can have a wavelength that is selected to match a vibrational mode and/or a vibrational-rotational mode of molecules of the third precursor. The first and second lasers can be applied concurrently, and the wavelength of the first laser can be different from the wavelength of the second laser. The method can include applying a second laser to resonantly excite molecules of the second precursor to produce the component that reacts with the nitrogen and/or nitrogen-associated species to form the nitride, in which the second laser can have a wavelength that is selected to match a vibrational mode and/or a vibrational-rotational mode of molecules of the second precursor. The first and second lasers can be applied concurrently, and the wavelength of the first laser is different from the wavelength of the second laser.

In general, in another aspect, a method of forming a nitride on a substrate is provided. The method includes providing a substrate made of a material having a melting point less than 600° C.; heating the substrate to a temperature that is less than 600° C.; applying a first laser to resonantly excite molecules of a first precursor that contains nitrogen to produce at least one of nitrogen or nitrogen-associated species that reacts with a component of a second precursor to form a nitride; and depositing the nitride on the substrate.

Implementations of the method can include one or more of the following features. The first laser can have a wavelength that is selected to match a vibrational mode and/or a vibrational-rotational mode of the molecules of the first precursor. In some examples, providing a substrate can include providing a plastic substrate, and depositing the nitride on the substrate can include depositing the nitride on the plastic substrate. The plastic substrate can include polyethylene terephthalate (PET) or polyamide 66 (PA 66). In some examples, providing a substrate can include providing a polymer substrate, and depositing the nitride on the substrate can include depositing the nitride on the polymer substrate. In some examples, providing a substrate can include providing a silicon substrate, and depositing the nitride on the substrate can include depositing the nitride on the silicon substrate. In some examples, providing a substrate can include providing an aluminum oxide ($Al_2O_3$) substrate, and depositing the nitride on the substrate can include depositing the nitride on the aluminum oxide substrate. In some examples, providing a substrate can include providing a silicon carbide (SiC-4H) substrate, and depositing the nitride on the substrate can include depositing the nitride on the silicon carbide substrate. In some examples, providing a substrate can include providing a silicon carbide (SiC-6H) substrate, and depositing the nitride on the substrate can include depositing the nitride on the silicon carbide substrate. In some examples, providing a substrate can include providing a lithium aluminum oxide ($LiAlO_2$) substrate, and depositing the nitride on the substrate can include depositing the nitride on the lithium aluminum oxide substrate.

In some examples, providing a substrate can include providing a substrate made of a material having a melting point in a range between 250° C. to 260° C., and heating the substrate can include heating the substrate to approximately 250° C. during deposition of the nitride on the substrate. In some examples, providing a substrate can includes providing a substrate made of a material having a melting point in a range from 250 to 300° C., and heating the substrate can include heating the substrate to a temperature in a range from 250 to 300° C., but not more than the melting point of the substrate material, during deposition of the nitride on the substrate. In some examples, the substrate can include polyethylene terephthalate (PET), polyamide 66 (PA 66), polybutylene terephthalate (PBT), $Sn_{95.5}Cu_4Ag_{0.5}$, $Pb_{88}Sn_{12}$, $Pb_{88}Sn_{15}$, $Pb_{80}Sn_{20}$, $Pb_{92}Sn_{5.5}Ag_{2.5}$, $Pb_{88}Sn_{10}Ag_2$, $Pb_{90}Sn_5Ag_5$, $Pb_{92.5}Sn_5Ag_{2.5}$, $Pb_{93.5}Sn_5Ag_{1.5}$, $Pb_{95.5}Sn_2Ag_{2.5}$, or $Pb_{90}Sn_{10}$. In some examples, providing a substrate can include providing a substrate made of a material having a melting point in a range from 300 to 350° C., and heating the substrate can include heating the substrate to a temperature in a range from 300 to 350° C., but not more than the melting point of the substrate material, during deposition of the nitride on the substrate. In some examples, the substrate can include poly(p-phenylene sulfide), lead (Pb), cadmium (Cd), $Pb_{92.5}In_5Ag_{2.5}$, $Pb_{94.5}Ag_{5.5}$, $Pb_{95}Ag_5$, $Pb_{97.5}Ag_{2.5}$, or $Cd_{95}Ag_5$. In some examples, providing a substrate can include providing a substrate made of a material having a melting point in a range from 350 to 400° C., and heating the substrate can include heating the substrate to a temperature in a range from 350 to 400° C., but not more than the melting point of the substrate material, during deposition of the nitride on the substrate. In some examples, the substrate can include polyether ether ketone (PEEK), polyetherimide (PEI), $Zn_{90}Cd_{10}$, $Zn_{95}Sn_5$, $Au_{98}Si_2$, $Au_{96.8}Si_{3.2}$, or $Au_{87.5}Ge_{12.5}$. In some examples, providing a substrate can include providing a substrate made of a material having a melting point in a range from 400 to 450° C., and heating the substrate can include heating the substrate to a temperature in a range from 400 to 450° C., but not more than the melting point of the substrate material, during deposition of the nitride on the substrate. In some examples, the substrate can include zinc (Zn). In some examples, providing a substrate can include providing a substrate made of a material having a melting point in a range from 450 to 500° C., and heating the substrate can include heating the substrate to a temperature in a range from 450 to 500° C., but not more than the melting point of the substrate material, during deposition of the nitride on the substrate. In some examples, the substrate can include $Au_{82}In_{18}$. In some examples, providing a substrate can include providing a substrate made of a material having a melting point not higher than 550° C., and heating the substrate includes heating the substrate to a temperature in a range from 500 to 550° C., but not more than the melting point of the substrate material, during deposition of the nitride on the substrate. In some examples, the substrate can include Al—Ca alloy, Al—Au alloy, or Al—Cu alloy. In some examples, providing a substrate can include providing a substrate made of a material having a melting point not higher than 600° C., and heating the substrate can include heating the substrate to a temperature in a range from 550 to 600° C., but not more than the melting point of the substrate material, during deposition of the nitride on the substrate. In some examples, the substrate can include soda-lime glass. Depositing the nitride on a substrate can include forming a thin film of nitride on the substrate.

In some examples, the second precursor can include gallium, and the nitride includes gallium nitride (GaN). In some examples, the second precursor can include trimethylgallium (($CH_3$)$_3$Ga). In some examples, the second precursor can include indium, and the nitride can include indium nitride (InN). In some examples, the second precursor can include trimethylindium (($CH_3$)$_3$In). In some examples, the second precursor can include aluminum, and the nitride can include aluminum nitride (AlN). In some examples, the second precursor can include trimethylaluminum (($CH_3$)$_3$Al). In some examples, the second precursor can include silicon, and the nitride can include silicon nitride ($Si_3N_4$). In some examples, the second precursor can include silane ($SiH_4$). In some examples, the second precursor can include titanium, and the nitride can include titanium nitride (TiN). In some examples, the second precursor can include titanium tetrachloride ($TiCl_4$). The second precursor can include carbon, and the nitride includes carbon nitride ($C_3N_4$). In some examples, the second precursor can include hydrocarbons, such as ethylene and/or methane.

Applying a laser to resonantly excite molecules of the first precursor can include applying a laser to resonantly excite molecules of ammonia ($NH_3$). Applying a laser can include applying a laser having a wavelength of 9.219 μm to resonantly excite the $NH_3$ molecules. Applying a laser can include projecting a laser along a path parallel to a surface of the substrate. A distance between the path and the substrate can be less than 30 mm. The method can include expanding a laser beam to form a wide laser beam, and in which applying a laser can include projecting the wide laser beam along a path parallel to a surface of the substrate. The method can include applying a second laser to resonantly excite molecules of a third precursor to produce at least one of nitrogen or nitrogen-associated species, in which the second laser can have a wavelength that is selected to match a vibrational mode and/or a vibrational-rotational mode of molecules of the third precursor. The first and second lasers can be applied concurrently, and the wavelength of the first laser can be different from the wavelength of the second laser. The method can include applying a second laser to resonantly excite molecules of the second precursor to produce the component that reacts with at least one of the nitrogen or nitrogen-associated species to form the nitride, in which the second laser can have a wavelength that is selected to match a vibrational mode and/or a vibrational-rotational mode of molecules of the second precursor. The first and second lasers can be applied concurrently, and the wavelength of the first laser can be different from the wavelength of the second laser.

In general, in another aspect, an apparatus includes a substrate made of a material having a melting point less than 600° C., and a layer of nitride deposited on the substrate. The nitride is formed by heating the substrate to a temperature that is less than 600° C., and applying a laser to resonantly excite molecules of a first precursor to produce at least one of nitrogen or nitrogen-associated species that reacts with a component of a second precursor to form the nitride.

Implementations of the apparatus can include one or more of the following features. The laser can have a wavelength that is selected to match a vibrational mode and/or a vibrational-rotational mode of the molecules of the first precursor. For example, the substrate can include a plastic substrate, a polymer substrate, a silicon substrate, an aluminum oxide ($Al_2O_3$) substrate, a silicon carbide (SiC-4H) substrate, a silicon carbide (SiC-6H) substrate, or a lithium aluminum oxide ($LiAlO_2$) substrate.

In some examples, the substrate can be made of a material having a melting point less than 260° C., and the nitride can be formed by maintaining the substrate at approximately 250° C., and applying the laser beam to resonantly excite molecules of the first precursor to produce at least one of nitrogen or nitrogen-associated species that reacts with the component of the second precursor to form the nitride. In some examples, the substrate can be made of a material having a melting point not higher than 300° C., and the nitride can be formed by maintaining the substrate at a temperature in a range between 250 to 300° C., and applying the laser beam to resonantly excite molecules of the first precursor to produce at least one of nitrogen or nitrogen-associated species that reacts with the component of the second precursor to form the nitride. In some examples, the substrate can be made of a material having a melting point not higher than 350° C., and the nitride can be formed by maintaining the substrate at a temperature in a range between 300 to 350° C., and applying the laser beam to resonantly excite molecules of the first precursor to produce at least one of nitrogen or nitrogen-associated species that reacts with the component of the second precursor to form the nitride. In some examples, the substrate can be made of a material having a melting point not higher than 400° C., and the nitride can be formed by maintaining the substrate at a temperature in a range between 350 to 400° C., and applying the laser beam to resonantly excite molecules of the first precursor to produce at least one of nitrogen or nitrogen-associated species that reacts with the component of the second precursor to form the nitride. In some examples, the substrate can be made of a material having a melting point not higher than 450° C., and the nitride can be formed by maintaining the substrate at a temperature in a range between 300 to 450° C., and applying the laser beam to resonantly excite molecules of the first precursor to produce at least one of nitrogen or nitrogen-associated species that reacts with the component of the second precursor to form the nitride. In some examples, the substrate can be made of a material having a melting point not higher than 500° C., and the nitride can be formed by maintaining the substrate at a temperature in a range between 450 to 500° C., and applying the laser beam to resonantly excite molecules of the first precursor to produce at least one of nitrogen or nitrogen-associated species that reacts with the component of the second precursor to form the nitride. In some examples, the substrate can be made of a material having a melting point not higher than 550° C., and the nitride can be formed by maintaining the substrate at a temperature in a range between 500 to 550° C., and applying the laser beam to resonantly excite molecules of the first precursor to produce at least one of nitrogen or nitrogen-associated species that reacts with the component of the second precursor to form the nitride. In some examples, the substrate can be made of a material having a melting point not higher than 600° C., and the nitride can be formed by maintaining the substrate at a temperature in a range between 550 to 600° C., and applying the laser beam to resonantly excite molecules of the first precursor to produce at least one of nitrogen or nitrogen-associated species that reacts with the component of the second precursor to form the nitride.

In some examples, the second precursor can include gallium (e.g., the second precursor can include trimethylgallium (($CH_3)_3Ga$)), and the nitride can include gallium nitride (GaN). The apparatus can include a gallium nitride transistor, a gallium nitride light emitting diode, a gallium nitride solar cell, and/or a gallium nitride power amplifier. In some examples, the second precursor can include indium (e.g., the second precursor can include trimethylindium (($CH_3)_3In$)), and the nitride can include indium nitride (InN). In some examples, the second precursor can include aluminum (e.g., the second precursor can include trimethylaluminum (($CH_3)_3Al$)), and the nitride can include aluminum nitride (AlN). In some examples, the second precursor includes silicon (e.g., the second precursor can include silane ($SiH_4$)), and the nitride includes silicon nitride ($Si_3N_4$). In some examples, the second precursor can include titanium (e.g., the second precursor can include titanium tetrachloride ($TiCl_4$)), and the nitride can include titanium nitride (TiN). In some examples, the second precursor can include carbon (e.g., the second precursor can include hydrocarbons, e.g., ethylene and/or methane), and the nitride can include carbon nitride ($C_3N_4$). For example, the first precursor can include ammonia ($NH_3$).

These features allow a user to fabricate nitride thin films, such as GaN thin films, at a low temperature (e.g., at around 250° C.) using a process that is compatible with silicon-based semiconductor processing.

DESCRIPTION OF DRAWINGS

FIGS. 4A to 4C are scanning electron microscope images.

FIGS. 5A to 5C are cross sectional scanning electron microscope images.

FIGS. 6A to 6C are X-ray diffraction spectra.

DETAILED DESCRIPTION

Figure 1:
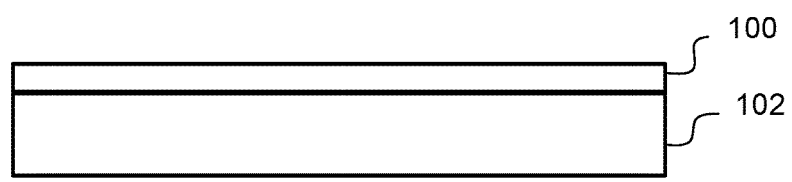
FIG. 1 is a diagram of an example of a nitride thin film on a substrate.

This disclosure relates to fabrication of nitride films by a process that includes resonant excitation of precursors. Referring to FIG. 1, a nitride thin film 100 is formed on a substrate 102 using a low-temperature laser-assisted metal organic chemical vapor deposition (LMOCVD) process. The nitride thin film 100 can be made of (but not limited to), e.g., gallium nitride (GaN), indium nitride (InN), aluminum nitride (AlN), silicon nitride ($Si_3N_4$), titanium nitride (TiN), zirconium nitride (ZrN), tungsten nitride ($W_2N$, WN, $WN_2$), vanadium nitride (VN), tantalum nitride (TaN), niobium nitride (NbN), scandium nitride (ScN), yttrium nitride (YN), chromium nitride (CrN), or carbon nitride ($C_3N_4$). The substrate 102 can be made of (but not limited to), e.g., plastic, polymer, silicon, aluminum oxide ($Al_2O_3$), silicon carbide (SiC-4H), silicon carbide (SiC-6H), lithium aluminum oxide ($LiAlO_2$), sapphire, or zinc oxide. The plastic substrate can be made of, e.g., polyethylene terephthalate (PET), polyamide 66 (PA 66)-TECAMID 66, or polybutylene terephthalate (PBT). The substrate 102 can also be made of, e.g., $Sn_{95.5}Cu_4Ag_{0.5}$, $Pb_{88}Sn_{12}$, $Pb_{88}Sn_{15}$, $Pb_{80}Sn_{20}$, $Pb_{92}Sn_{5.5}Ag_{2.5}$, $Pb_{88}Sn_{10}Ag_2$, $Pb_{90}Sn_5Ag_5$, $Pb_{92.5}Sn_5Ag_{2.5}$, $Pb_{93.5}Sn_5Ag_{1.5}$, $Pb_{95.5}Sn_2Ag_{2.5}$, or $Pb_{80}Sn_{10}$, poly(p-phenylene sulfide), lead (Pb), cadmium (Cd), $Pb_{92.5}In_5Ag_{2.5}$, $Pb_{94.5}Ag_{5.5}$, $Pb_{95}Ag_5$, $Pb_{97.5}Ag_{2.5}$, or $Cd_{95}Ag_5$, polyether ether ketone (PEEK), polyetherimide (PEI), $Zn_{90}Cd_{10}$, $Zn_{95}Sn_5$, $Au_{98}Si_2$, $Au_{96.8}Si_{3.2}$, or $Au_{87.5}Ge_{12.5}$, zinc, $Au_{82}In_{18}$, Al—Ca alloy, Al—Au alloy, Al—Cu alloy, or soda-lime glass.

After the nitride thin film 100 is formed on the substrate 102, the nitride thin film 100 can be further processed (e.g., patterned and etched) and additional material layers can be formed on the nitride thin film 100 to produce devices, such as transistors, light emitting diodes, solar cells, or power amplifiers.

Figure 2:
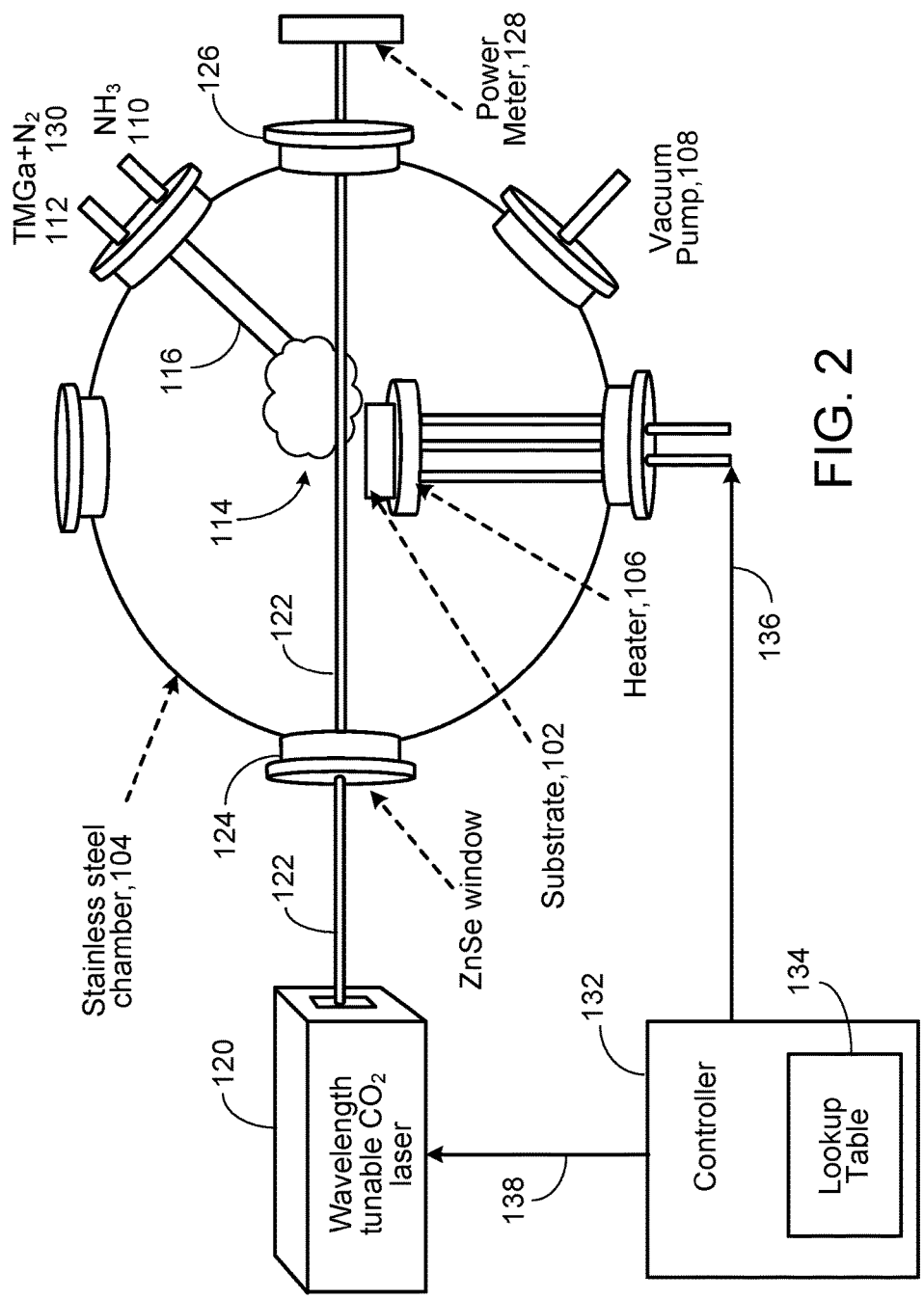
FIG. 2 is a diagram of an example of a low-temperature laser-assisted metal organic chemical vapor deposition system.

Referring to FIG. 2, in some implementations, the low-temperature laser-assisted metal organic chemical vapor deposition process is conducted by introducing precursors into a chamber and using laser to excite one or more of the precursors to assist the formation of nitride on a substrate. A substrate 102 is cleaned, dried, and loaded into a chamber 104 and placed on a heater 106. The walls of the chamber 104 can be made of, e.g., stainless steel, aluminum, aluminum alloys, aluminum bronze, nickel, nickel alloys, copper, brass, indium, gold, platinum, zirconium, tungsten, molybdenum, tantalum, titanium, niobium, or brazing alloys. The chamber 104 is evacuated to a low pressure using a vacuum pump 108. A first precursor 110 (containing nitrogen) and a second precursor 112 are provided to the chamber 104 and introduced to a region 114 in a vicinity of the substrate 102 through a pipe 116. The chamber pressure is maintained at a predetermined level during the nitride growth process.

The heater 106 heats the substrate 102 and maintains the substrate 102 at a temperature that is lower than the melting point of the substrate 102. In some implementations, the heater 106 is controlled by a controller 132 in which the user can enter a desired temperature and the controller 132 controls the heater 106 (through a signal line 136) to heat the substrate 102 to the temperature specified by the user.

A laser 120 (which can be, e.g., a laser with a fixed wavelength or a tunable wavelength) generates a laser beam 122 that enters the chamber 104 through a window 124 (e.g., a ZnSe window) and propagates inside the chamber 104 along a path parallel to the surface of the substrate 102. The laser beam 122 exits the chamber 104 through a second window 126 (e.g., a ZnSe window) and is directed toward a power meter 128, which monitors the power of the laser beam 122.

The laser 120 is tuned such that the laser beam 122 has a wavelength that can resonantly excite the molecules of the first precursor 110, channeling energy selectively into corresponding bonds in individual precursor molecules, enabling the molecules to efficiently decompose at the surface of the substrate 102. The excited first precursor molecules react with the second precursor 112 to form nitride on the heated substrate 102. In some implementations, the laser 120 is a tunable laser that can be controlled by the controller 132 so that the user can control the wavelength and the power of the laser beam 122 using the controller (by sending control signals through a signal line 138).

In some implementations, the controller 132 includes a lookup table 134 that stores information about resonant frequencies of precursor materials. For example, the controller 132 may have a display that provides a user interface to allow the user to enter information about the precursor being used. For example, the controller 132 may provide a menu having a list of precursors, and the user may choose a precursor from the menu. The lookup table 134 includes information about a mapping between the precursor and the laser wavelength that can be used to resonantly excite the molecules of the precursor. When the user specifies a precursor, the controller 132 automatically adjusts the laser 120 to produce a laser beam 122 with the appropriate wavelength that can be used to resonantly excite the molecules of the specified precursor.

For example, after the laser-assisted metal organic chemical vapor deposition, a nitride thin film, which can be either crystalline or amorphous, can be formed on the substrate 102. The film can be a smooth film or a film that contains many grains.

Below are exemplary process conditions for conducting a low-temperature laser-assisted metal organic chemical vapor deposition to form a nitride on the substrate 102. In this example, the substrate 102 is made of silicon or aluminum oxide ($Al_2O_3$). After the substrate 102 is loaded on the heater 106, the chamber 104 is evacuated to a base pressure of $1 \times 10^{-3}$ Torr using the vacuum pump 108. The first precursor 110 is ammonia ($NH_3$), and the ammonia is pumped into the chamber 104 at a flow rate of 1200 sccm. The second precursor 112 is trimethylgallium (($CH_3)_3Ga$ or TMGa), and TMGa is carried into the chamber 104 using nitrogen ($N_2$) 130 as the carrier gas at a flow rate of 16 sccm. The chamber pressure is maintained at 100 Torr during the nitride growth process. The heater 106 heats the substrate 102 and maintains the substrate 102 at a temperature in a range from 250° C. to 600° C. The laser 120 is a $CO_2$ laser that is tuned such that the laser beam 122 has a wavelength of 9.219 μm with a power of 100 W. The distance between the laser beam 122 and the substrate surface is, e.g., 20 mm. The laser beam 122 resonantly excites the N—H rotational-vibrational transition mode of the $NH_3$ molecules.

The laser beam 122 resonantly excites the $NH_3$ molecules, which react with the second precursor 112 trimethylgallium (($CH_3)_3Ga$) to produce gallium nitride. The chemical reaction is shown below:

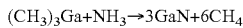
$$(CH_3)_3Ga + NH_3 \rightarrow 3GaN + 6CH_4$$

Without being bound by the theory provided herein, it is possible that the laser beam 122 resonantly excites the $NH_3$ molecules resulting in the following. $NH_3$ molecules are decomposed, and fragments such as $NH_2$, NH, N, and H are released. $NH_3$ molecules are excited from a fundamental state to an excited state, and the potential barrier in decomposing $NH_3$ molecules is reduced. The resonant excitation influences reaction pathways through which $NH_3$ molecules are decomposed and react with other molecules.

The laser-assisted metal organic chemical vapor deposition allows high quality GaN films to be grown on a substrate in which the temperature of the substrate can be as low as 250° C. It is possible that some $NH_3$ molecules are decomposed by the laser beam 122, and some of the excited $NH_3$ molecules decompose at the surface of the heated substrate.

One of the advantages of laser-assisted metal organic chemical vapor deposition is that the amount of ammonia can be reduced, as compared to the conventional metal organic chemical vapor deposition. By using laser excitation, a higher percentage of ammonia can react with the other precursor to form a nitride.

When a different material is used for the first precursor 110, the laser beam 122 is tuned to select a wavelength that matches, e.g., the vibrational mode(s) and/or the vibrational-rotational mode(s) of the molecules of the first precursor 110. For example, the user can select the precursor from a menu provided by the user interface of the controller 132, and the controller 132 adjusts the laser 120 to the corresponding wavelength. In some implementations, the controller 132 provides a user interface to allow the user to enter information about the material used for the substrate 102. The lookup table 134 includes information about a mapping between substrate materials and melting points. The controller 132 controls the heater 106 to heat the substrate 102 to a temperature below the melting point of the substrate material specified by the user.

Various types of materials can be used for the second precursor 112. For example, the second precursor 112 can be a material that includes indium, such as trimethylindium (($CH_3)_3In$). The trimethylindium reacts with the ammonia 110 excited by the laser beam 122 to produce indium nitride (InN). The chemical reaction is shown below.

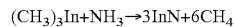
$$(CH_3)_3In + NH_3 \rightarrow 3InN + 6CH_4$$

For example, the second precursor 112 can be a material that includes aluminum, such as trimethylaluminum (($CH_3)_3Al$). The trimethylaluminum reacts with the ammonia 110 excited by the laser beam 122 to produce aluminum nitride (AlN). The chemical reaction is shown below.

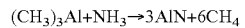
$$(CH_3)_3Al + NH_3 \rightarrow 3AlN + 6CH_4$$

For example, the second precursor 112 can be a material that includes silicon, such as silane ($SiH_4$). The silane reacts with the ammonia 110 excited by the laser beam 122 to produce silicon nitride ($Si_3N_4$). The chemical reaction is shown below.

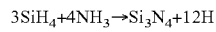
$$3SiH_4 + 4NH_3 \rightarrow Si_3N_4 + 12H$$

For example, the second precursor 112 can be a material that includes titanium, such as titanium tetrachloride ($TiCl_4$). The titanium tetrachloride reacts with the ammonia 110 excited by the laser beam 122 to produce titanium nitride (TiN). The chemical reaction is shown below.

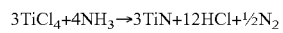
$$3TiCl_4 + 4NH_3 \rightarrow 3TiN + 12HCl + \tfrac{1}{2}N_2$$

For example, the second precursor 112 can be a material that includes carbon, such as hydrocarbons. Examples of hydrocarbons that are suitable for forming nitrides include ethylene and methane. The hydrocarbons react with the ammonia 110 excited by the laser beam 122 to produce carbon nitride ($C_3N_4$). When methane is used as the second precursor, it is estimated that the overall chemical reaction is as follows, though the detailed reaction processes may be more complicated.

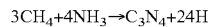
$$3CH_4 + 4NH_3 \rightarrow C_3N_4 + 24H$$

A feature of the laser-assisted metal organic chemical vapor deposition process is that because a laser beam excites the first precursor, the temperature of the substrate can be maintained at a lower level compared to a process that does not use laser excitation. For example, conventional synthetic techniques for growing GaN films, such as metal organic chemical vapor deposition (MOCVD), molecular beam epitaxy (MBE), and hydride vapor phase epitaxy (HVPE) may require a high substrate temperature, e.g., from 750° C. to 1100° C., to achieve efficient decomposition of precursor materials, provide sufficient nitrogen supply, and promote atom surface diffusion. Use of high substrate temperature (e.g., 750° C. or more), which is typical in conventional methods for depositing nitride, prevents the use of substrate materials having low melting points. By contrast, because the laser-assisted metal organic chemical vapor deposition can be performed while the substrate is maintained at a lower temperature (e.g., 600° C. or less), the substrate can be made of materials having a lower melting point. Using materials having lower melting points allows the substrates to be made larger at lower costs. For example, a large plastic substrate is much cheaper than a large sapphire substrate. An advantage of laser-assisted metal organic chemical vapor deposition is that because the nitride film is grown at a lower temperature, when the substrate cools down to room temperature, the stress due to different rates of contraction between the nitride film and the substrate can be reduced (compared to conventional methods).

In some implementations, the substrate temperature used for the laser-assisted metal organic chemical vapor deposition can be determined based in part on the material used for the substrate 102. For example, the substrate 102 can be heated to and maintained at approximately 250° C. during the laser-assisted metal organic chemical vapor deposition as long as the substrate 102 is made of a material that has a melting point higher than 250° C. Unless otherwise stated, in this description, the melting point of a material refers to the melting point of the material at atmospheric pressure. For some materials, the melting point may change depending on the ambient pressure. The heating temperature of the substrate 102 is selected to be lower than the melting point of the substrate 102 throughout the entire laser-assisted metal organic chemical vapor deposition process.

For example, if the substrate 102 is made of a material having a melting point in a range from 250° C. to 300° C., the substrate 102 can be heated to and maintained at a temperature in a range from 250° C. to 300° C., but not more than the melting point of the substrate material, during deposition of the nitride on the substrate 102. For example, the substrate can be made of polyethylene terephthalate (PET), polyamide 66 (PA 66), polybutylene terephthalate (PBT), $Sn_{95.5}Cu_4Ag_{0.5}$, $Pb_{88}Sn_{12}$, $Pb_{88}Sn_{15}$, $Pb_{80}Sn_{20}$, $Pb_{92}Sn_{5.5}Ag_{2.5}$, $Pb_{88}Sn_{10}Ag_2$, $Pb_{90}Sn_5Ag_5$, $Pb_{92.5}Sn_5Ag_{2.5}$, $Pb_{93.5}Sn_5Ag_{1.5}$, $Pb_{95.5}Sn_2Ag_{2.5}$, $Pb_{90}Sn_{10}$, or a combination of two or more of the above.

For example, if the substrate 102 is made of a material having a melting point in a range from 300° C. to 350° C., the substrate 102 can be heated to and maintained at a temperature in a range from 300° C. to 350° C., but not more than the melting point of the substrate material, during deposition of the nitride on the substrate 102. For example, the substrate can be made of poly(p-phenylene sulfide), lead (Pb), cadmium (Cd), $Pb_{92.5}In_5Ag_{2.5}$, $Pb_{94.5}Ag_{5.5}$, $Pb_{95}Ag_5$, $Pb_{97.5}Ag_{2.5}$, $Cd_{95}Ag_5$, or a combination of two or more of the above.

For example, if the substrate 102 is made of a material having a melting point in a range from 350° C. to 400° C., the substrate 102 can be heated to and maintained at a temperature in a range from 350° C. to 400° C., but not more than the melting point of the substrate material, during deposition of the nitride on the substrate 102. For example, the substrate can be made of polyether ether ketone (PEEK), polyetherimide (PEI), $Zn_{90}Cd_{10}$, $Zn_{95}Sn_5$, $Au_{98}Si_2$, $Au_{96.8}Si_{3.2}$, or $Au_{87.5}Ge_{12.5}$, or a combination of two or more of the above.

For example, if the substrate 102 is made of a material having a melting point in a range from 400° C. to 450° C., the substrate 102 can be heated to and maintained at a temperature in a range from 400° C. to 450° C., but not more than the melting point of the substrate material, during deposition of the nitride on the substrate 102. For example, the substrate can be made of zinc.

For example, if the substrate 102 is made of a material having a melting point in a range from 450° C. to 500° C., the substrate 102 can be heated to and maintained at a temperature in a range from 450° C. to 500° C., but not more than the melting point of the substrate material, during deposition of the nitride on the substrate 102. For example, the substrate can be made of $Au_{82}In_{18}$.

For example, if the substrate 102 is made of a material having a melting point in a range from 500° C. to 550° C., the substrate 102 can be heated to and maintained at a temperature in a range from 500° C. to 550° C., but not more than the melting point of the substrate material, during deposition of the nitride on the substrate 102. For example, the substrate can be made of Al—Ca alloy, Al—Au alloy, Al—Cu alloy, or a combination or two or more of the above.

For example, if the substrate 102 is made of a material having a melting point in a range from 550° C. to 600° C., the substrate 102 can be heated to and maintained at a temperature in a range from 550° C. to 600° C., but not more than the melting point of the substrate material, during deposition of the nitride on the substrate 102. For example, the substrate can be made of soda-lime glass.

In some implementations, a second laser beam is passed through the region 114, in which the second laser beam has a wavelength selected to match, e.g., the vibrational mode(s) and/or the rotational-vibrational transition mode(s) of the molecules of the second precursor 112. Exciting the molecules of the second precursor allows the substrate to be maintained at a temperature lower than if the second laser beam was not used.

In some implementations, three or more precursors are used to form a nitride. In that case, three or more lasers, each tuned to a wavelength useful for exciting a corresponding precursor, can be used. For example, two or more precursors are used to generate nitrogen, and one precursor is used to generate germanium. In that case, two or more lasers are tuned to have wavelengths that correspond to the resonant frequencies of the two or more precursors for generating nitrogen, and one laser is tuned to have a wavelength that corresponds to the resonant frequency of the precursor for generating germanium. For example, two or more precursors are used to generate germanium, and one precursor is used to generate nitrogen. In that case, two or more lasers are tuned to have wavelengths that correspond to the resonant frequencies of the two or more precursors for generating germanium, and one laser is tuned to have a wavelength that corresponds to the resonant frequency of the precursor for generating nitrogen. For example, two or more precursors are used to generate germanium, and two or more precursors are used to generate nitrogen. In that case, two or more lasers are tuned to have wavelengths that correspond to the resonant frequencies of the two or more precursors for generating germanium, and two or more lasers are tuned to have wavelengths that correspond to the resonant frequencies of the precursors for generating nitrogen.

Figure 9:
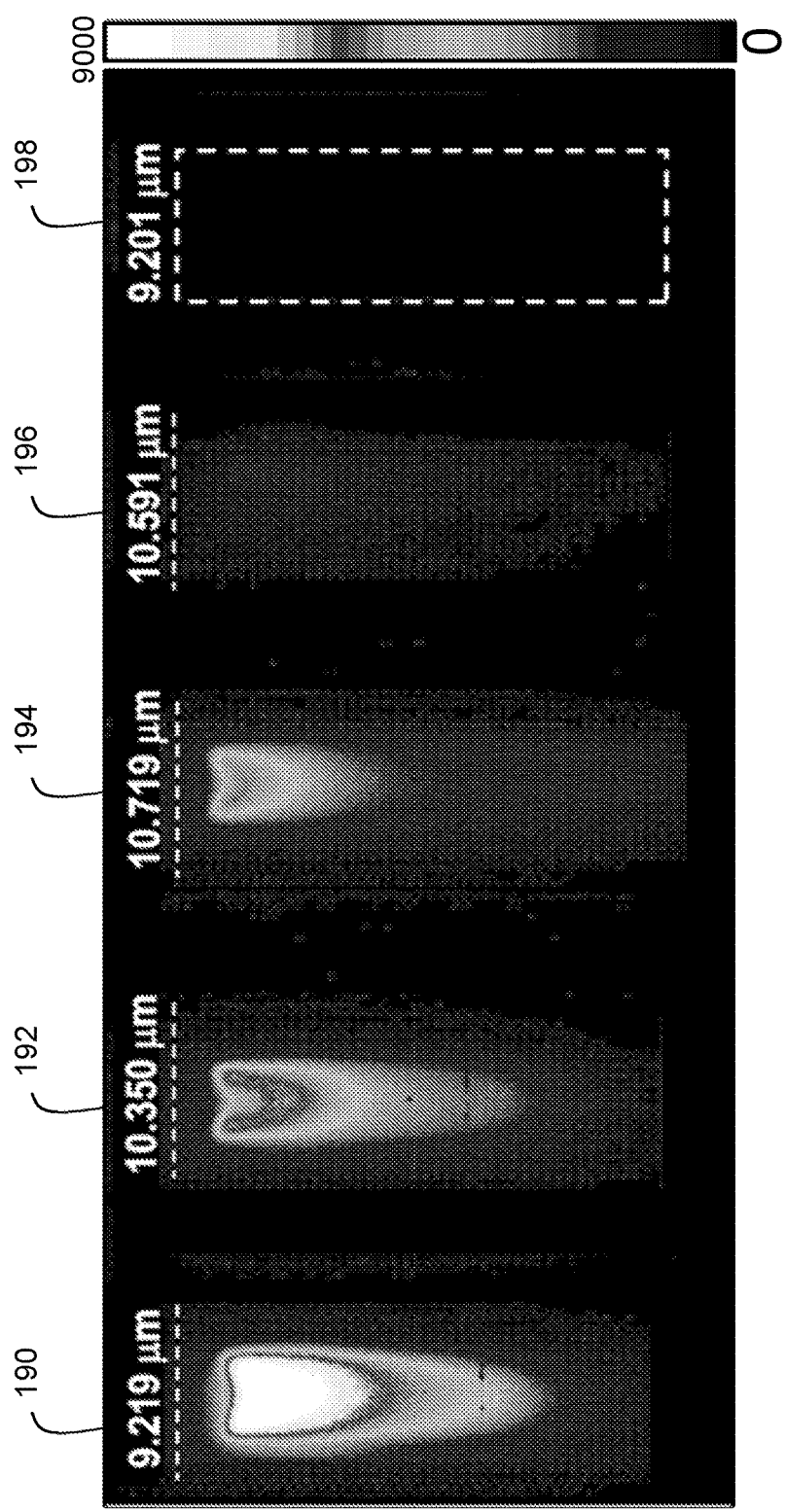
FIG. 9 shows images of $NH_3$ flows under laser irradiation at different wavelengths.

For a given precursor material, the molecules of the precursor may have more than one excitation mode. For example, FIG. 9 shows optical images 190, 192, 194, 196, and 198 of $NH_3$ flows under laser irradiation at different wavelengths in open air. To generate the image 190, a laser beam having a wavelength of 9.219 μm was used to irradiate the $NH_3$ flow. To generate the images 192, a laser beam having a wavelength of 10.350 μm was used. To generate the image 194, a laser having a wavelength of 10.719 μm was used. To generate the image 196, a laser having a wavelength of 10.591 μm was used. To generate the image 198, a laser having a wavelength of 9.201 μm was used. Stronger emissions were observed from $NH_3$ flows when irradiated at resonant wavelengths (e.g., 9.219 μm, 10.350 μm, and 10.719 μm) than those at non-resonant wavelengths (e.g., 10.591 μm and 9.201 μm). The shape and brightness of the laser-induced plasma reflect dissociation of $NH_3$ molecules under the laser irradiation. As shown in FIG. 9, laser irradiation at resonant wavelengths lead to $NH_3$ flows of brighter colors and expanded diameters due to accelerated $NH_3$ dissociation, promoted chemical reactions, and increased reactive species concentrations. The brightest $NH_3$ flow is observed under the resonant excitation of the NH rotational-vibrational transition excitation at 9.219 μm.

Figure 10:
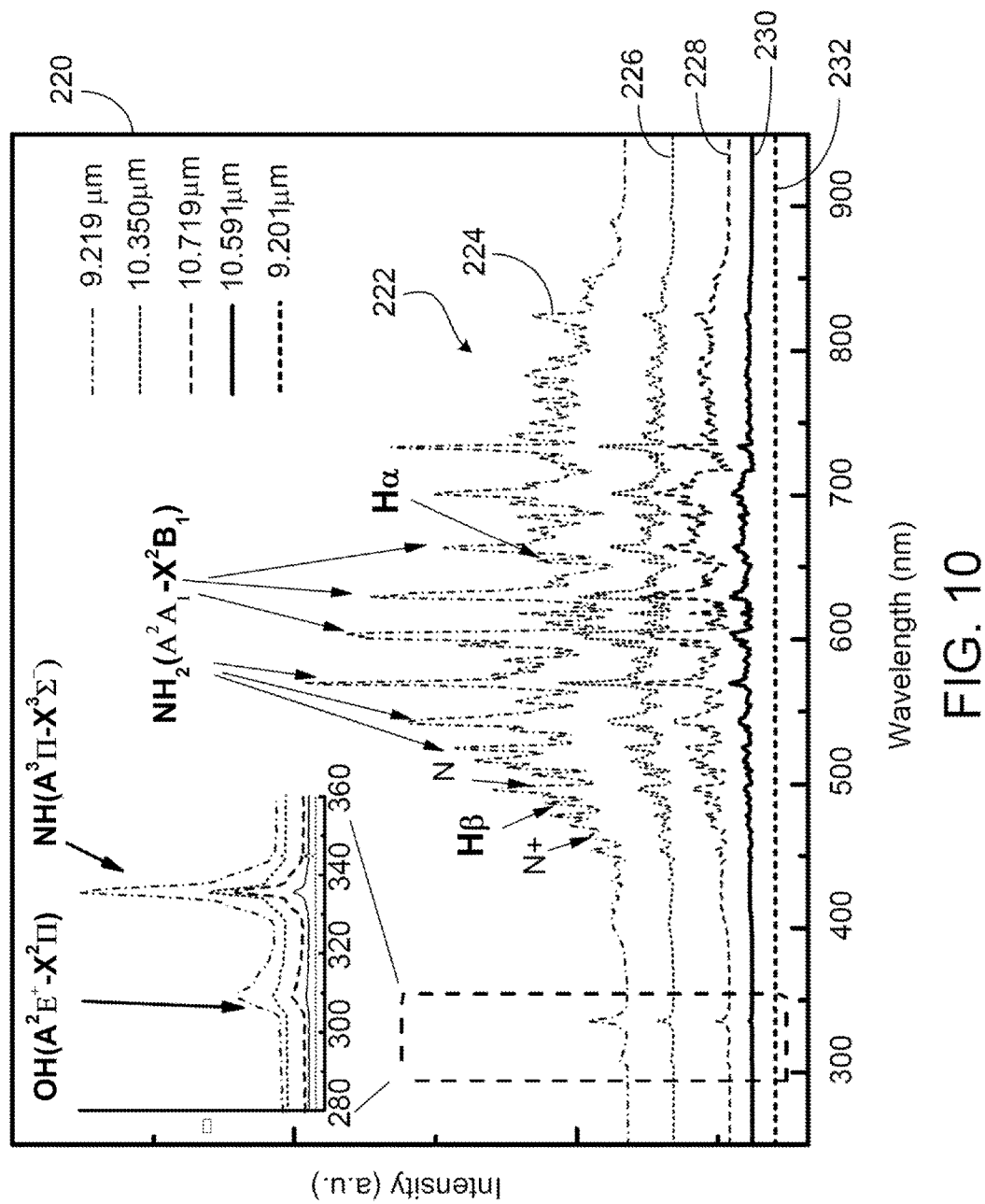
FIG. 10 is a graph showing optical emission spectra of the laser-irradiated $NH_3$ flows.

FIG. 10 is a graph 220 that shows the optical emission spectra (OES) 222 of the laser-irradiated $NH_3$ flows. Line 224 represents the optical emission spectra when the $NH_3$ flow is irradiated with a laser beam having a wavelength of 9.219 μm. Line 226 represents the optical emission spectra when the $NH_3$ flow is irradiated with a laser beam having a wavelength of 10.350 μm. Line 228 represents the optical emission spectra when the $NH_3$ flow is irradiated with a laser beam having a wavelength of 10.719 μm. Line 230 represents the optical emission spectra when the $NH_3$ flow is irradiated with a laser beam having a wavelength of 10.591 μm. Line 232 represents the optical emission spectra when the $NH_3$ flow is irradiated with a laser beam having a wavelength of 9.201 μm.

Emissions from OH, NH, $N^+$, $H_\alpha$, N, and $H_\beta$ are identified at 309, 336, 463, 486, 496, and 656 nm, respectively. Strong emissions from N—$H_2$ radicals are observed at 525, 543, 569, 603, 629, and 663 nm in the OES spectra from resonantly excited $NH_3$ flows, indicating effective dissociation of $NH_3$ molecules. Increased emission intensities of OH, NH, $NH_2$, N, $N^+$, and H were observed at the resonant wavelength of 9.219 μm. Weak emission intensities of NH and $NH_2$ radicals were identified when irradiated at the non-resonant wavelength of 10.591 μm. No emission peak was observed at the non-resonant wavelength of 9.201 μm. The above results show that resonantly exciting the $NH_3$ molecules leads to $NH_3$ decomposition at room temperature and supply of various N-related species. For example, N, NH, and $NH_2$ are active nitrogen species that are useful for growing nitrides. Therefore, effectively dissociating $NH_3$ molecules and promoting the supply of N-related species contributes positively to the growth of nitrides.

Figure 12:
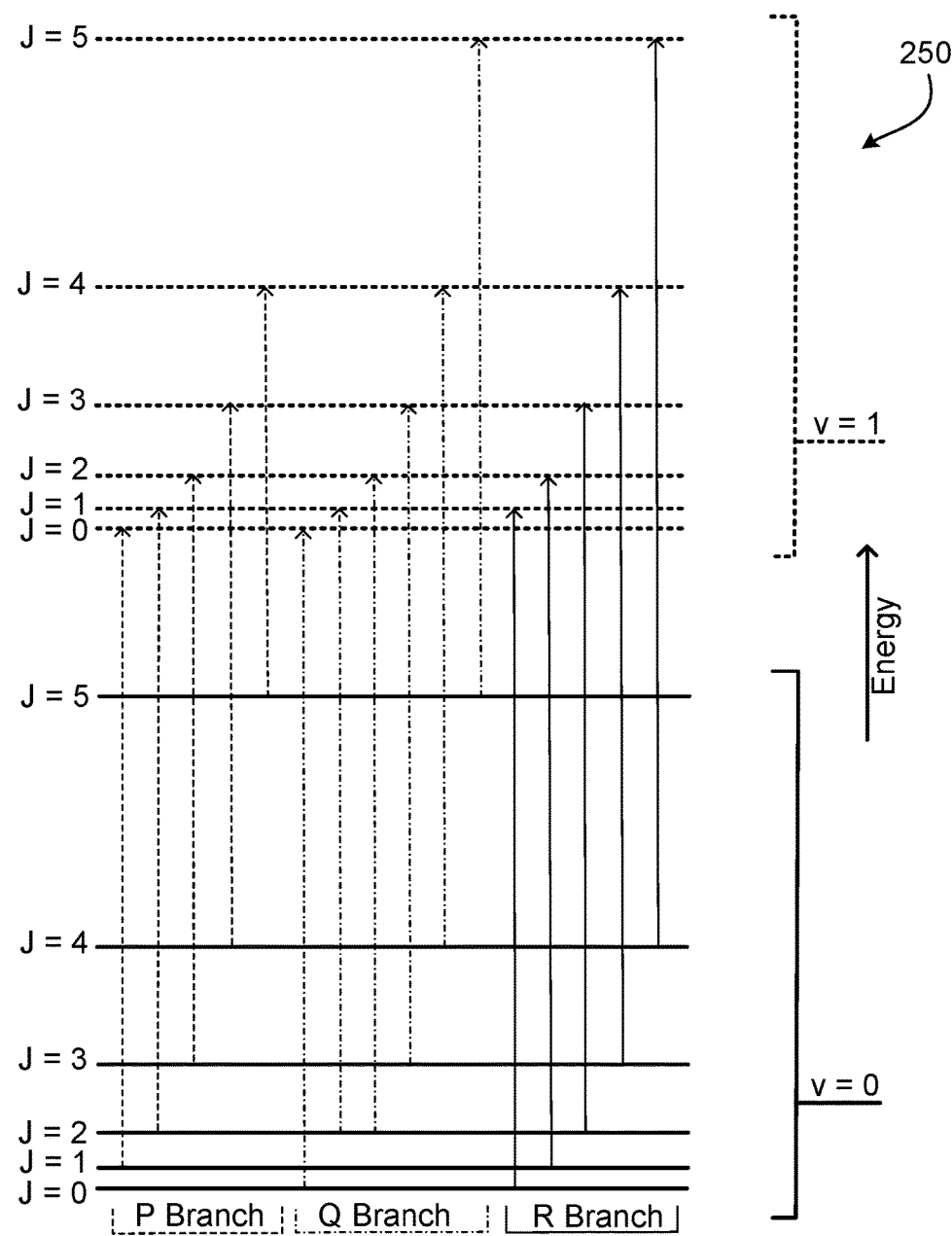
FIG. 12 is a schematic vibrational-rotational energy level diagram.

In some implementations, the laser beam 122 can resonantly excite the molecules of the precursor material by selecting the laser wavelength to match vibrational modes or rotational-vibrational modes of the molecules of the precursor. FIG. 12 is an exemplary schematic vibrational-rotational energy level diagram 250 for a linear molecule in which "V" refers to vibrational state and "J" refers to rotational state. A vibrational mode refers to a transition that involves only changes in vibrational states, such as the Q branch shown in FIG. 12. A vibrational-rotational mode (also called rotational-vibrational mode, rovibrational, or ro-vibrational mode) refers to a transition involving changes in both vibrational and rotational states, such as the P and R branches in FIG. 12.

Each vibrational mode or vibrational-rotational mode has a resonant frequency. When the laser beam 122 has a frequency that matches the resonant frequency of the molecules of the precursor, the laser beam 122 may resonantly excite the molecules and cause the molecules to transition from a first vibrational or rotational state having a lower energy level to a second vibrational or rotational state having a higher energy level, such as the transitions shown in FIG. 12. Because a laser has a certain bandwidth, the laser beam can resonantly excite the precursor molecules even if the laser center frequency is slightly different from the resonant frequency of the vibrational mode or vibrational-rotational mode of the precursor molecules. When the laser center frequency is tuned to the resonant frequency of the vibrational mode or vibrational-rotational mode of the precursor molecules, resonant excitation is strongest. The resonant excitation becomes weaker as the laser frequency drifts away from the resonant frequency of the vibrational mode or vibrational-rotational mode of the precursor molecules.

In this document, when we say that the laser beam has a wavelength that matches the vibrational mode or vibrational-rotational mode of the precursor molecules, we mean that the laser beam has a frequency that matches the resonant frequency of the vibrational mode or vibrational-rotational mode of the precursor molecules. The precursor molecules may have several vibrational modes and vibrational-rotational modes, and the wavelength of the laser beam can be selected so that the laser frequency matches the resonant frequency of at least one of the vibrational modes or vibrational-rotational modes of the precursor molecules.

Figure 3:
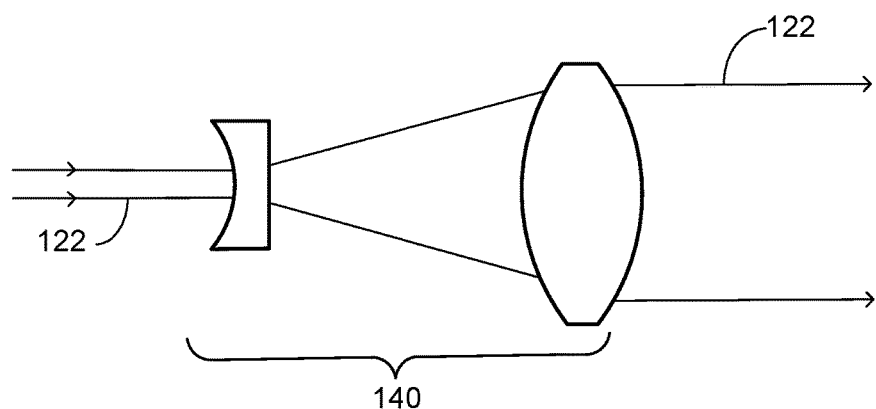
FIG. 3 is a diagram of a beam expander.

Referring to FIG. 3, in some implementations, a beam expander 140 can be used to expand the laser beam 122 along a plane parallel to the surface of the substrate 102 in order to cover more area. In some implementations, the laser beam 122 is scanned back and forth across a region to cover more area. In some implementations, multiple laser beams having the same wavelength are directed toward the precursor cloud in the region 114 to increase the excitation of precursor molecules.

Figure 11:
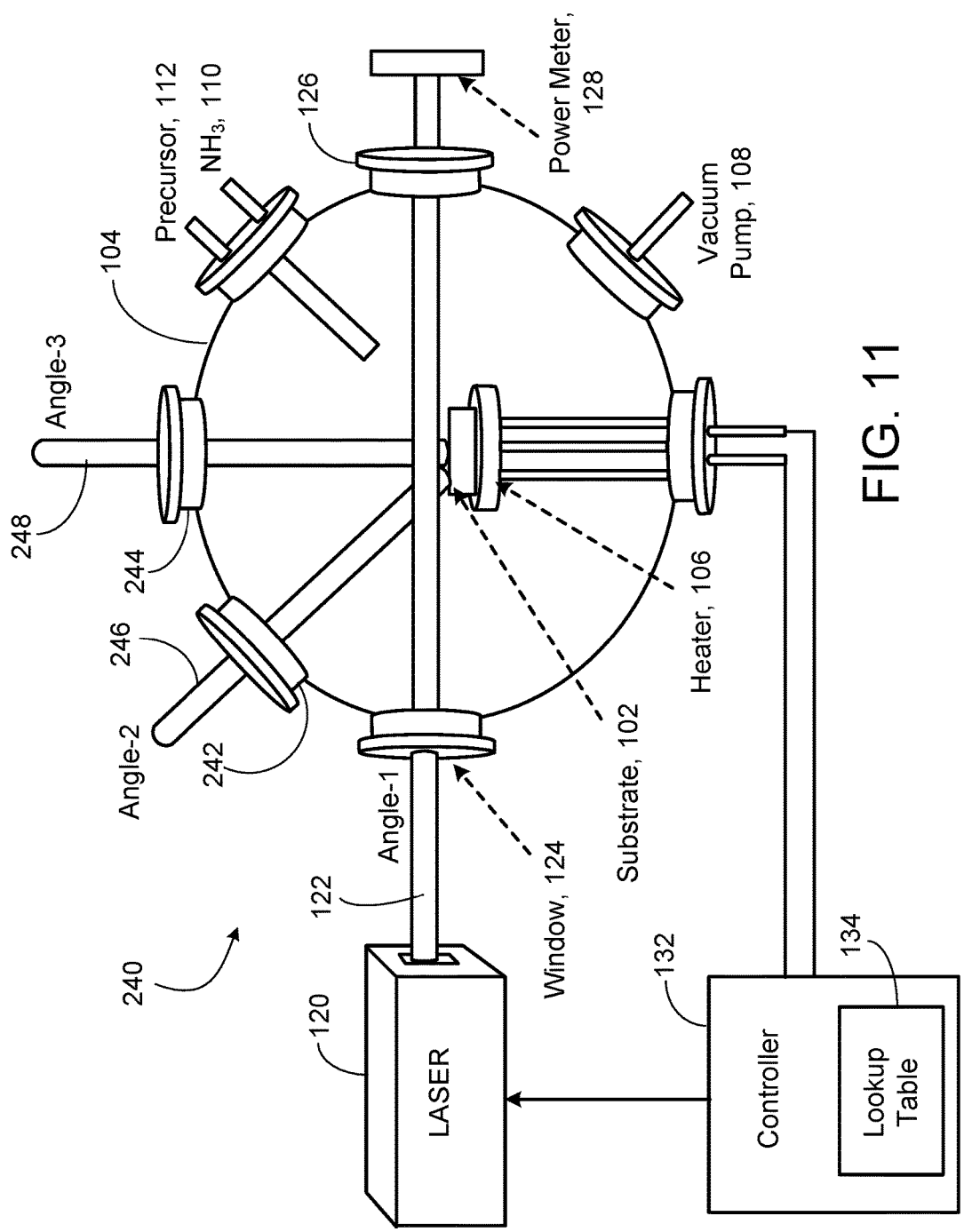
FIG. 11 is a diagram of an example of a low-temperature laser-assisted metal organic chemical vapor deposition system.

Referring to FIG. 11, in some implementations, an exemplary system 240 for laser-assisted metal organic chemical vapor deposition use one or more laser beams that propagate along paths that are not parallel to the surface of the substrate 102. The system 240 shown in FIG. 11 is similar to the system of FIG. 2, except that the system 240 includes additional windows 242 and 244 to allow laser beams 246 and 248, respectively, to enter the chamber 104 and irradiate the precursor materials. In some examples, the laser beams 246 and 248 can be generated from the laser 120, e.g., using beam splitters. In some examples, additional laser sources are used to generate the laser beams 246 and 248.

In the example shown in FIG. 11, three windows 124, 242, and 244 are provided, in which the window 124 allows the laser beam 122 to propagate along a path parallel to the surface of the substrate 102, and windows 242 and 244 allow laser beams 246 and 248 to propagate along paths that are not parallel to the surface of the substrate 102. In some examples, only two windows are provided to allow two laser beams to enter the chamber. In some examples, more than three windows are provided to allow more than three laser beams to enter the chamber. In some examples, two or more windows are positioned to allow two or more laser beams to propagate along directions parallel to the surface of the substrate 102. In some examples, the windows are positioned such that all of the laser beams propagate along directions that are not parallel to the surface of the substrate 102.

In some examples, only one of the laser beams 122, 246, and 248 is used to irradiate the precursor materials at a given time. In some examples, two or more of the laser beams 122, 246, and 248 are used to irradiate the precursor materials simultaneously. In some examples, the laser beams 122, 246, and 248 have the same wavelength. In some examples, the laser beams 122, 246, and 248 have different wavelengths. For example, each laser beam may be tuned to a particular wavelength to excite one or more vibrational modes, and/or one or more vibrational-rotational modes of one or more of the precursor materials.

In some examples, the substrate 102 is placed on a motorized platform that can move the substrate 102 along x, y, and z axes, and tilt the substrate 102 at various angles. By controlling the motorized platform, the angle(s) between the propagation path(s) of the laser beam(s) and the surface of the substrate 102 can be adjusted. In some examples, the angle(s) between the propagation path(s) of the laser beam(s) and the surface of the substrate 102 are set before the deposition of the nitride on the substrate begins and are not changed during the deposition process. In some examples, the angle(s) between the propagation path(s) of the laser beam(s) and the surface of the substrate 102 are varied during the process of depositing the nitride on the substrate.

FIG. 4A shows a scanning electron microscope (SEM) image 150 of a GaN film grown by laser assisted metal organic chemical vapor deposition at 250° C. The GaN film shows grains of 30±5 nm with hexagonal facets.

FIG. 4B shows a scanning electron microscope image 152 of a GaN film grown by laser assisted metal organic chemical vapor deposition at 600° C. The size of the grains with hexagonal facets increased to 200±10 nm. A GaN film having larger grains has a better quality (compared to a GaN film having smaller grains). In general, a larger grain size leads to fewer grain boundaries and lower defect densities. A decreased amount of boundaries and defects will improve corresponding electrical, optical, and mechanical properties of the GaN film.

FIG. 4C shows a scanning electron microscope image 154 of a GaN film grown by the conventional metal organic chemical vapor deposition at 600° C. The GaN film in FIG. 4C shows a rougher surface compared with that in FIG. 4B.

FIG. 5A shows a cross sectional scanning electron microscope image 160 of a GaN film grown on an $Al_2O_3$ substrate by LMOCVD at 250° C. for an hour. The thickness of the GaN film is about 0.15 µm.

FIG. 5B shows a cross sectional scanning electron microscope image 162 of a GaN film grown on an $Al_2O_3$ substrate by LMOCVD at 600° C. for an hour. The thickness of the GaN film is about 12 µm.

FIG. 5C shows a cross-sectional scanning electron microscope image of a GaN film grown on an $Al_2O_3$ substrate by MOCVD at 600° C. The thickness of the GaN film is about 2.6 µm. Comparing FIGS. 5B and 5C, it can be seen that an increased growth rate of 12 µm/h was achieved by LMOCVD at 600° C., which is about 4.6 times faster than that of conventional MOCVD (which is about 2.6 µm/h in the example of FIG. 5C).

FIG. 6A shows an X-ray diffraction spectrum 170 of the GaN film grown on a sapphire substrate at 250° C. by LMOCVD. The films for FIGS. 6A to 6C are the same as the films for FIGS. 4A to 4C. The spectrum 170 includes a GaN(0002) peak 172 and an $Al_2O_3$(0006) peak 174. The GaN(0002) peak demonstrates the formation of GaN crystals.

FIG. 6B shows an X-ray diffraction spectrum 176 of the GaN film grown on a sapphire substrate at 600° C. by LMOCVD. The spectrum 176 includes a GaN(0002) peak 178 and an $Al_2O_3$(0006) peak 180.

FIG. 6C shows an X-ray diffraction spectrum 182 of the GaN film grown on a sapphire substrate at 600° C. by MOCVD. The spectrum 182 includes a GaN(0002) peak 184 and an $Al_2O_3$(0006) peak 186. Comparing the GaN(0002) peaks in FIGS. 6A to 6C, it can be seen that among the three examples, LMOCVD at 600° C. produces GaN film with the best crystalline quality.

Figure 7:
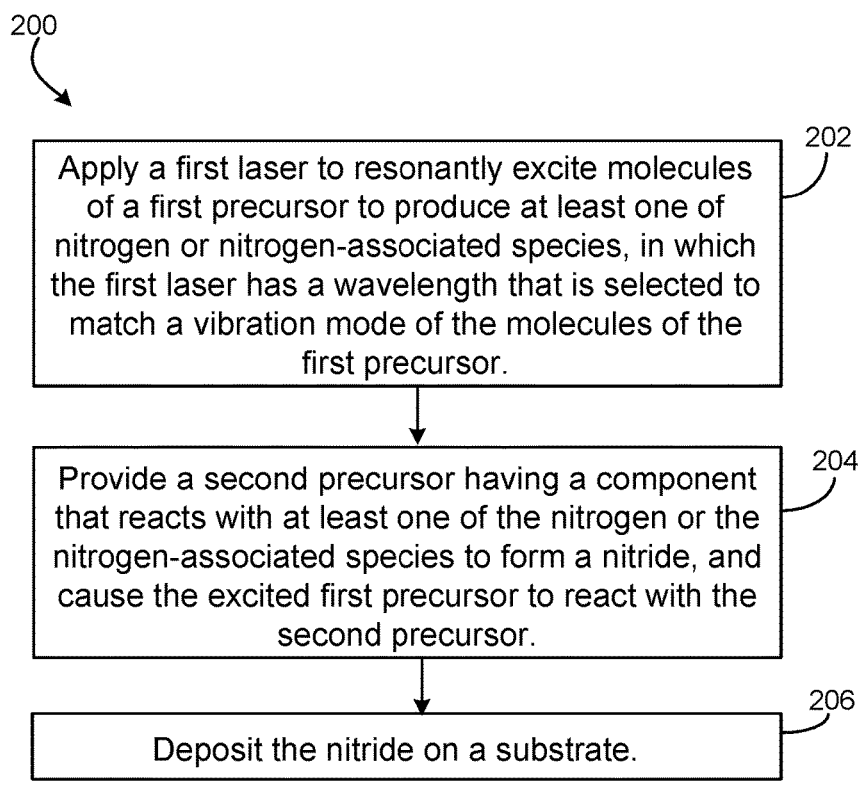
FIGS. 7 and 8 are flow diagrams of processes.

Referring to FIG. 7, in some implementations, a process 200 for fabricating a nitride film on a substrate includes applying a first laser to resonantly excite molecules of a first precursor to produce at least one of nitrogen or nitrogen-associated species, in which the first laser has a wavelength that is selected to match a vibrational mode(s) and/or vibrational-rotational mode(s) of the molecules of the first precursor (202). For example, the first precursor can include ammonia ($NH_3$), and the laser can have a wavelength of 9.219 µm to resonantly excite the $NH_3$ molecules. The laser can be projected along a path parallel to the surface of the substrate. The distance between the path and the substrate can be, e.g., less than 30 mm, or for example, approximately 20 mm. For example, the laser beam can be expanded to form a wide laser beam, and the wide laser beam can be projected along a path parallel to the surface of the substrate. For example, the nitrogen-associated species can include N, NH, and/or $NH_2$. For example, the substrate can include a plastic substrate, a polymer substrate, a silicon substrate, an aluminum oxide ($Al_2O_3$) substrate, a silicon carbide (SiC-4H) substrate, a silicon carbide (SiC-6H) substrate, a lithium aluminum oxide ($LiAlO_2$) substrate, a sapphire substrate, or a zinc oxide substrate.

The process 200 includes providing a second precursor having a component that reacts with at least one of the nitrogen or the nitrogen-associated species to form a nitride, causing the excited first precursor to react with the second precursor (204). For example, the second precursor can include gallium (e.g., the second precursor can include trimethylgallium (($CH_3)_3Ga$)), and the nitride can include gallium nitride (GaN). For example, the second precursor can include indium (e.g., the second precursor can include trimethylindium (($CH_3)_3In$)), and the nitride comprises indium nitride (InN). For example, the second precursor can include aluminum (e.g., the second precursor can include trimethylaluminum (($CH_3)_3Al$)), and the nitride can include aluminum nitride (AlN). For example, the second precursor can include silicon (e.g., the second precursor can include silane ($SiH_4$)), and the nitride can include silicon nitride ($Si_3N_4$). For example, the second precursor can include titanium (e.g., the second precursor can include titanium tetrachloride ($TiCl_4$)), and the nitride can include titanium nitride (TiN). For example, the second precursor can include carbon (e.g., the second precursor can include hydrocarbons, such as ethylene and/or methane), and the nitride can include carbon nitride ($C_3N_4$).

The process 200 includes depositing the nitride on a substrate (206). For example, a thin film of nitride can be formed on the substrate. The process 200 includes maintaining the substrate at a temperature not more than 600° C., in which the substrate is not subjected to more than 600° C. during deposition of the nitride (206). For example, the substrate can be maintained at approximately 250° C., in which the substrate is subjected no more than 260° C. during deposition of the nitride. For example, the substrate can be maintained at a temperature in a range from 250 to 300° C., in which the substrate is subjected no more than 300° C. during deposition of the nitride. For example, the substrate can be maintained at a temperature in a range from 300 to 350° C., in which the substrate is subjected no more than 350° C. during deposition of the nitride. For example, the substrate can be maintained at a temperature in a range from 350 to 400° C., in which the substrate is subjected no more than 400° C. during deposition of the nitride. For example, the substrate can be maintained at a temperature in a range from 400 to 450° C., in which the substrate is subjected no more than 450° C. during deposition of the nitride. For example, the substrate can be maintained at a temperature in a range from 450 to 500° C., in which the substrate is subjected no more than 500° C. during deposition of the nitride. For example, the substrate can be maintained at a temperature in a range from 500 to 550° C., in which the substrate is subjected no more than 550° C. during deposition of the nitride. For example, the substrate can be maintained at a temperature in a range from 550 to 600° C., in which the substrate is subjected no more than 600° C. during deposition of the nitride.

Optionally, in some implementations, the process 200 can include applying a second laser to resonantly excite molecules of a third precursor to produce at least one of nitrogen or nitrogen-associated species, in which the second laser has a wavelength that is selected to match vibrational mode(s) and/or vibrational-rotational mode(s) of molecules of the third precursor. Optionally, in some implementations, the process 200 can include applying a second laser to resonantly excite molecules of the second precursor to produce the component that reacts with at least one of the nitrogen or nitrogen-associated species to form the nitride, in which the second laser has a wavelength that is selected to match vibration mode(s) and/or vibrational-rotational mode(s) of molecules of the second precursor. In the above examples, the first and second lasers can be applied concurrently, and the wavelength of the first laser can be different from the wavelength of the second laser.

Figure 8:
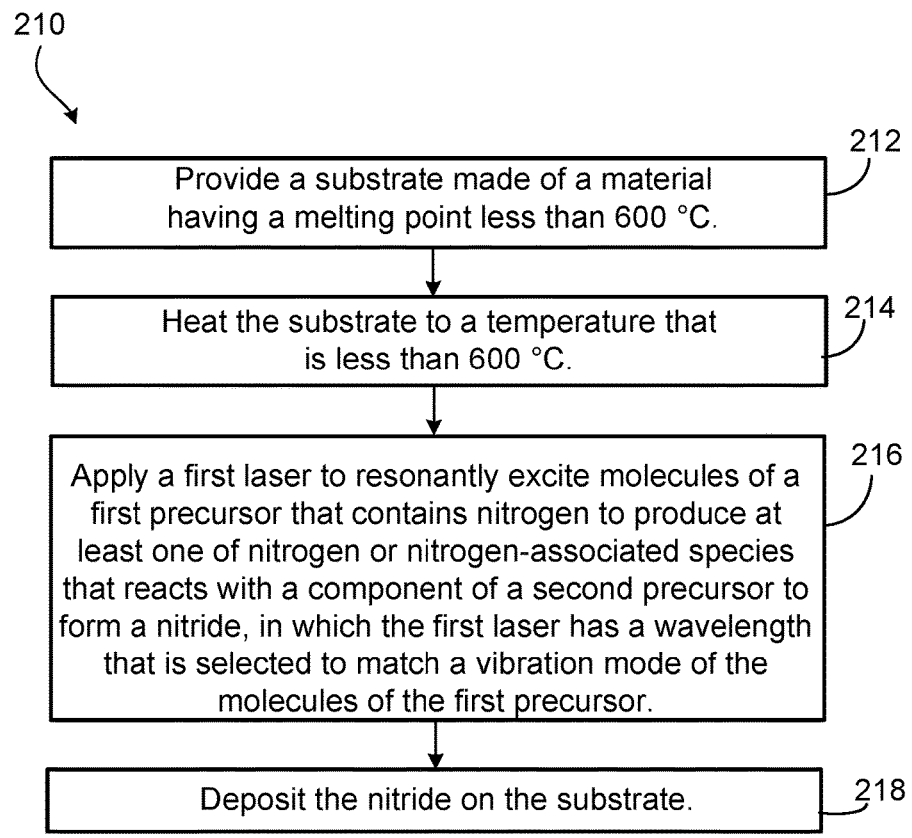

Referring to FIG. 8, in some implementations, a process 210 for forming a nitride on a substrate includes providing a substrate made of a material having a melting point less than 600° C. (212). For example, the substrate can include a plastic substrate (e.g., polyethylene terephthalate (PET) or polyamide 66 (PA 66) substrate), a polymer substrate, a silicon substrate, an aluminum oxide ($Al_2O_3$) substrate, a silicon carbide (SiC-4H) substrate, a silicon carbide (SiC-6H) substrate, or a lithium aluminum oxide ($LiAlO_2$) substrate.

The process 210 includes heating the substrate to a temperature that is less than 600° C. (214). For example, the substrate can be made of a material having a melting point in a range between 250° C. to 260° C., and the substrate can be heated to approximately 250° C. during deposition of the nitride on the substrate. For example, the substrate can be made of a material having a melting point in a range from 250 to 300° C., and the substrate can be heated to a temperature in a range from 250 to 300° C., but not more than the melting point of the substrate material, during deposition of the nitride on the substrate. The substrate can include, e.g., polyethylene terephthalate (PET), polyamide 66 (PA 66), polybutylene terephthalate (PBT), $Sn_{95.5}Cu_4Ag_{0.5}$, $Pb_{88}Sn_{12}$, $Pb_{88}Sn_{15}$, $Pb_{80}Sn_{20}$, $Pb_{92}Sn_{5.5}Ag_{2.5}$, $Pb_{88}Sn_{10}Ag_2$, $Pb_{90}Sn_5Ag_5$, $Pb_{92.5}Sn_5Ag_{2.5}$, $Pb_{93.5}Sn_5Ag_{1.5}$, $Pb_{95.5}Sn_2Ag_{2.5}$, and/or $Pb_{90}Sn_{10}$. For example, the substrate can be made of a material having a melting point in a range from 300 to 350° C., and the substrate can be heated to a temperature in a range from 300 to 350° C., but not more than the melting point of the substrate material, during deposition of the nitride on the substrate. For example, the substrate can include poly(p-phenylene sulfide), lead (Pb), cadmium (Cd), $Pb_{92.5}In_5Ag_{2.5}$, $Pb_{94.5}Ag_{5.5}$, $Pb_{95}Ag_5$, $Pb_{97.5}Ag_{2.5}$, and/or $Cd_{95}Ag_5$. For example, the substrate can be made of a material having a melting point in a range from 350 to 400° C., and the substrate can be heated to a temperature in a range from 350 to 400° C., but not more than the melting point of the substrate material, during deposition of the nitride on the substrate. For example, the substrate can include polyether ether ketone (PEEK), polyetherimide (PEI), $Zn_{90}Cd_{10}$, $Zn_{95}Sn_5$, $Au_{98}Si_2$, $Au_{96.8}Si_{3.2}$, and/or $Au_{87.5}Ge_{12.5}$. For example, the substrate can be made of a material having a melting point in a range from 400 to 450° C., and the substrate can be heated to a temperature in a range from 400 to 450° C., but not more than the melting point of the substrate material, during deposition of the nitride on the substrate. For example, the substrate can include zinc (Zn). For example, the substrate can be made of a material having a melting point in a range from 450 to 500° C., and the substrate can be heated to a temperature in a range from 450 to 500° C., but not more than the melting point of the substrate material, during deposition of the nitride on the substrate. For example, the substrate can include $Au_{82}In_{18}$. For example, the substrate can be made of a material having a melting point not higher than 550° C., and the substrate can be heated to a temperature in a range from 500 to 550° C., but not more than the melting point of the substrate material, during deposition of the nitride on the substrate. For example, the substrate can include Al—Ca alloy, Al—Au alloy, and/or Al—Cu alloy. For example, the substrate can be made of a material having a melting point not higher than 600° C., and the substrate can be heated to a temperature in a range from 550 to 600° C., but not more than the melting point of the substrate material, during deposition of the nitride on the substrate. For example, the substrate can include soda-lime glass.

The process 210 includes applying a first laser to resonantly excite molecules of a first precursor that contains nitrogen to produce at least one of nitrogen or nitrogen-associated species that reacts with a component of a second precursor to form a nitride, in which the first laser has a wavelength that is selected to match vibrational mode(s) and/or vibrational-rotational mode(s) of the molecules of the first precursor (216).

For example, the first precursor can be ammonia ($NH_3$). The laser used to resonantly excite the ammonia molecules can have a wavelength of 9.219 μm. For example, the second precursor can include gallium (e.g., the second precursor can include trimethylgallium ((CH3)3Ga))), and the nitride can include gallium nitride (GaN). For example, the second precursor can include indium (e.g., the second precursor can include trimethylindium ((CH3)3In)), and the nitride can include indium nitride (InN). For example, the second precursor can include aluminum (e.g., the second precursor can include trimethylaluminum ((CH3)3Al))), and the nitride can include aluminum nitride (AlN). For example, the second precursor can include silicon (the second precursor can include silane (SiH4)), and the nitride can include silicon nitride (Si3N4). For example, the second precursor can include titanium (e.g., the second precursor can include tetrachloride (TiCl4)), and the nitride comprises titanium nitride (TiN). For example, the second precursor can include carbon (e.g., the second precursor can include hydrocarbons, such as ethylene and/or methane), and the nitride can include carbon nitride ($C_3N_4$).

The process 210 includes depositing the nitride on the substrate (218). For example, a thin film of nitride can be formed on the substrate. For example, the laser can be projected along a path parallel to a surface of the substrate. The distance between the laser propagation path and the substrate can be, e.g., less than 30 mm. For example, the laser beam can be expanded to form a wide laser beam, and the wide laser beam can be projected along a path parallel to a surface of the substrate.

Optionally, in some implementations, the process 210 can include applying a second laser to resonantly excite molecules of a third precursor to produce at least one of nitrogen or nitrogen-associated species, in which the second laser has a wavelength that is selected to match vibrational mode(s) and/or vibrational-rotational mode(s) of molecules of the third precursor. Optionally, in some implementations, the process 210 can include applying a second laser to resonantly excite molecules of the second precursor to produce the component that reacts with at least one of the nitrogen or nitrogen-associated species to form the nitride, in which the second laser has a wavelength that is selected to match vibrational mode(s) and/or vibrational-rotational mode(s) of molecules of the second precursor. In the above examples, the first and second lasers can be applied concurrently, and the wavelength of the first laser can be different from the wavelength of the second laser.

The controller 132 can be implemented in digital electronic circuitry, or in computer hardware, firmware, software, or in combinations of them. Some of the features of the controller 132 can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output. Some of the functions of the controller 132 can be implemented in a remote server or a cloud server.

The features of the controller 132 can be implemented in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

Although some examples have been discussed above, other implementations and applications are also within the scope of the following claims. For example, the chamber 104 can be made of other materials that do not react with reactants inside the chamber 104. The substrate 102 can be made of a material different from those described above. The first precursor, the second precursor, and the nitride can be different from those described above. The laser-assisted metal organic chemical vapor deposition can be performed under processing conditions (e.g., substrate temperature and chamber pressure) that are different from those described above. In some implementations, when two or more laser beams are used to irradiate the precursor materials, the laser beams can have wavelengths tuned to excite different vibrational modes and/or vibrational-rotational modes of the precursor material. For example, for the precursor material $NH_3$, a first laser beam can have a wavelength of 9.219 μm, a second laser beam can have a wavelength of 10.350 μm, and a third laser beam can have a wavelength of 10.719 μm. In some implementations, the window of the chamber can have a shape of an elongated slit such that the laser beam irradiation angle relative to the substrate surface can be continuously varied within a specified range. In some examples, when a laser beam having a wide bandwidth is used, the laser beam may resonantly excite several vibrational modes and/or vibrational-rotational modes of the precursor molecules.

What is claimed is:

1. A method comprising:
applying a first laser to resonantly excite molecules of a first precursor;
providing a second precursor having a component that reacts with at least one of the excited precursor, nitrogen derived from the excited precursor, or nitrogen-associated species derived from the excited precursor to form a nitride; and
depositing the nitride on a substrate, in which the substrate is subjected to no more than 750° C. during deposition of the nitride.

2. The method of claim 1 in which the first laser having a wavelength that is selected to match at least one of a vibrational mode or a vibrational-rotational mode of the molecules of the first precursor.

3. The method of claim 1 in which the nitrogen-associated species comprise at least one of N, NH, or $NH_2$.

4. The method of claim 1, comprising causing the excited first precursor to react with the second precursor, and maintaining the substrate at a temperature not more than 600° C.

5. The method of claim 1, comprising causing the excited first precursor to react with the second precursor, and maintaining the substrate at approximately 250° C., in which the substrate is subjected to no more than 260° C. during deposition of the nitride.

6. The method of claim 1, comprising causing the excited first precursor to react with the second precursor, and maintaining the substrate at a temperature in a range from 250 to 300° C., in which the substrate is subjected to no more than 300° C. during deposition of the nitride.

7. The method of claim 1, comprising causing the excited first precursor to react with the second precursor, and maintaining the substrate at a temperature in a range from 300 to 350° C., in which the substrate is subjected to no more than 350° C. during deposition of the nitride.

8. The method of claim 1, comprising causing the excited first precursor to react with the second precursor, and maintaining the substrate at a temperature in a range from 350 to 400° C., in which the substrate is subjected to no more than 400° C. during deposition of the nitride.

9. The method of claim 1, comprising causing the excited first precursor to react with the second precursor, and maintaining the substrate at a temperature in a range from 400 to 450° C., in which the substrate is subjected to no more than 450° C. during deposition of the nitride.

10. The method of claim 1, comprising causing the excited first precursor to react with the second precursor, and maintaining the substrate at a temperature in a range from 450 to 500° C., in which the substrate is subjected to no more than 500° C. during deposition of the nitride.

11. The method of claim 1, comprising causing the excited first precursor to react with the second precursor, and maintaining the substrate at a temperature in a range from 500 to 550° C., in which the substrate is subjected to no more than 550° C. during deposition of the nitride.

12. The method of claim 1, comprising causing the excited first precursor to react with the second precursor, and maintaining the substrate at a temperature in a range from 550 to 600° C.

13. The method of claim 1 in which depositing the nitride comprises forming a thin film of nitride on the substrate.

14. The method of claim 1 in which providing a second precursor comprises providing a second precursor that includes gallium, and the nitride comprises gallium nitride (GaN).

15. The method of claim 14 in which providing the second precursor comprises providing trimethylgallium $((CH_3)_3Ga)$.

16. The method of claim 1 in which providing a second precursor comprises providing a second precursor that includes indium, and the nitride comprises indium nitride (InN).

17. The method of claim 16 in which providing the second precursor comprises providing trimethylindium $((CH_3)_3In)$.

18. The method of claim 1 in which providing a second precursor comprises providing a second precursor that includes aluminum, and the nitride comprises aluminum nitride (AlN).

19. The method of claim 18 in which providing the second precursor comprises providing trimethylaluminum $((CH_3)_3Al)$.

20. The method of claim 1 in which providing a second precursor comprises providing a second precursor that includes silicon, and the nitride comprises silicon nitride $(Si_3N_4)$.

21. The method of claim 20 in which providing the second precursor comprises providing silane $(SiH_4)$.

22. The method of claim 1 in which providing a second precursor comprises providing a second precursor that includes titanium, and the nitride comprises titanium nitride (TiN).

23. The method of claim 22 in which providing the second precursor comprises providing titanium tetrachloride $(TiCl_4)$.

24. The method of claim 1 in which providing a second precursor comprises providing a second precursor that includes carbon, and the nitride comprises carbon nitride $(C_3N_4)$.

25. The method of claim 24 in which providing the second precursor comprises providing hydrocarbons.

26. The method of claim 25 in which providing hydrocarbons comprises providing at least one of ethylene or methane.

27. The method of claim 1 in which applying a laser to resonantly excite molecules of a first precursor comprises applying a laser to resonantly excite molecules of ammonia $(NH_3)$.

28. The method of claim 27 in which applying a laser comprises applying a laser having a wavelength of 9.219 μm to resonantly excite the $NH_3$ molecules.

29. The method of claim 1 in which applying a laser comprises projecting a laser along a path parallel to a surface of the substrate.

30. The method of claim 29 in which a distance between the path and the substrate is less than 30 mm.

31. The method of claim 30 in which a distance between the path and the substrate is approximately 20 mm.

32. The method of claim 1, comprising expanding a laser beam to form a wide laser beam, and in which applying a laser comprises projecting the wide laser beam along a path parallel to a surface of the substrate.

33. The method of claim 1 in which depositing the nitride on a substrate comprises depositing the nitride on at least one of a plastic substrate, a polymer substrate, a silicon substrate, an aluminum oxide $(Al_2O_3)$ substrate, a silicon carbide (SiC-4H) substrate, a silicon carbide (SiC-6H) substrate, a lithium aluminum oxide $(LiAlO_2)$ substrate, or a zinc oxide substrate.

34. The method of claim 1 in which depositing the nitride on a substrate comprises depositing the nitride on a sapphire substrate.

35. The method of claim 1, comprising applying a second laser to resonantly excite molecules of a third precursor to produce at least one of nitrogen or nitrogen-associated species.

36. The method of claim 35 in which the second laser has a wavelength that is selected to match at least one of a vibrational mode or a vibrational-rotational mode of molecules of the third precursor.

37. The method of claim 35 in which the first and second lasers are applied concurrently, and the wavelength of the first laser is different from the wavelength of the second laser.

38. The method of claim 1, comprising applying a second laser to resonantly excite molecules of the second precursor to produce the component that reacts with at least one of the excited precursor, the nitrogen derived from the excited precursor, or the nitrogen-associated species derived from the excited precursor to form the nitride.

39. The method of claim 38, in which the second laser has a wavelength that is selected to match at least one of a vibrational mode or a vibrational-rotational mode of molecules of the second precursor.

40. The method of claim 38 in which the first and second lasers are applied concurrently, and the wavelength of the first laser is different from the wavelength of the second laser.

41. A method of forming a nitride on a substrate, the method comprising:
providing a substrate made of a material having a melting point less than 600° C.;

heating the substrate to a temperature that is less than 600° C.;

applying a first laser to resonantly excite molecules of a first precursor that contains nitrogen to produce at least one of nitrogen or nitrogen-associated species that reacts with a component of a second precursor to form a nitride; and depositing the nitride on the substrate, in which the substrate is subjected to no more than 600° C. during deposition of the nitride.

42. The method of claim 41 in which the first laser has a wavelength that is selected to match at least one of a vibrational mode or a vibrational-rotational mode of the molecules of the first precursor.

43. The method of claim 41 in which providing a substrate comprises providing a plastic substrate, and depositing the nitride on the substrate comprises depositing the nitride on the plastic substrate.

44. The method of claim 43 in which the plastic substrate comprises at least one of polyethylene terephthalate (PET) or polyamide 66 (PA 66).

45. The method of claim 41 in which providing a substrate comprises providing a polymer substrate, and depositing the nitride on the substrate comprises depositing the nitride on the polymer substrate.

46. The method of claim 41 in which providing a substrate comprises providing a silicon substrate, and depositing the nitride on the substrate comprises depositing the nitride on the silicon substrate.

47. The method of claim 41 in which providing a substrate comprises providing an aluminum oxide ($Al_2O_3$) substrate, and depositing the nitride on the substrate comprises depositing the nitride on the aluminum oxide substrate.

48. The method of claim 41 in which providing a substrate comprises providing a silicon carbide (SiC-4H) substrate, and depositing the nitride on the substrate comprises depositing the nitride on the silicon carbide substrate.

49. The method of claim 41 in which providing a substrate comprises providing a silicon carbide (SiC-6H) substrate, and depositing the nitride on the substrate comprises depositing the nitride on the silicon carbide substrate.

50. The method of claim 41 in which providing a substrate comprises providing a lithium aluminum oxide ($LiAlO_2$) substrate, and depositing the nitride on the substrate comprises depositing the nitride on the lithium aluminum oxide substrate.

51. The method of claim 41 in which providing a substrate comprises providing a substrate made of a material having a melting point in a range between 250° C. to 260° C., and heating the substrate comprises heating the substrate to approximately 250° C. during deposition of the nitride on the substrate.

52. The method of claim 41 in which providing a substrate comprises providing a substrate made of a material having a melting point in a range from 250 to 300° C., and heating the substrate comprises heating the substrate to a temperature in a range from 250 to 300° C., but not more than the melting point of the substrate material, during deposition of the nitride on the substrate.

53. The method of claim 52 in which the substrate comprises at least one of polyethylene terephthalate (PET), polyamide 66 (PA 66), polybutylene terephthalate (PBT), $Sn_{95.5}Cu_4Ag_{0.5}$, $Pb_{88}Sn_{12}$, $Pb_{85}Sn_{15}$, $Pb_{80}Sn_{20}$, $Pb_{92}Sn_{5.5}Ag_{2.5}$, $Pb_{88}Sn_{10}Ag_2$, $Pb_{90}Sn_5Ag_5$, $Pb_{92.5}Sn_5Ag_{2.5}$, $Pb_{93.5}Sn_5Ag_{1.5}$, $Pb_{95.5}Sn_2Ag_{2.5}$, or $Pb_{90}Sn_{10}$.

54. The method of claim 41 in which providing a substrate comprises providing a substrate made of a material having a melting point in a range from 300 to 350° C., and heating the substrate comprises heating the substrate to a temperature in a range from 300 to 350° C., but not more than the melting point of the substrate material, during deposition of the nitride on the substrate.

55. The method of claim 54 in which the substrate comprises at least one of poly(p-phenylene sulfide), lead (Pb), cadmium (Cd), $Pb_{92.5}In_5Ag_{2.5}$, $Pb_{94.5}Ag_{5.5}$, $Pb_{95}Ag_5$, $Pb_{97.5}Ag_{2.5}$, or $Cd_{95}Ag_5$.

56. The method of claim 41 in which providing a substrate comprises providing a substrate made of a material having a melting point in a range from 350 to 400° C., and heating the substrate comprises heating the substrate to a temperature in a range from 350 to 400° C., but not more than the melting point of the substrate material, during deposition of the nitride on the substrate.

57. The method of claim 56 in which the substrate comprises at least one of polyether ether ketone (PEEK), polyetherimide (PEI), $Zn_{90}Cd_{10}$, $Zn_{95}Sn_5$, $Au_{98}Si_2$, $Au_{96.8}Si_{3.2}$, or $Au_{87.5}Ge_{12.5}$.

58. The method of claim 41 in which providing a substrate comprises providing a substrate made of a material having a melting point in a range from 400 to 450° C., and heating the substrate comprises heating the substrate to a temperature in a range from 400 to 450° C., but not more than the melting point of the substrate material, during deposition of the nitride on the substrate.

59. The method of claim 58 in which the substrate comprises zinc (Zn).

60. The method of claim 41 in which providing a substrate comprises providing a substrate made of a material having a melting point in a range from 450 to 500° C., and heating the substrate comprises heating the substrate to a temperature in a range from 450 to 500° C., but not more than the melting point of the substrate material, during deposition of the nitride on the substrate.

61. The method of claim 60 in which the substrate comprises $Au_{82}In_{18}$.

62. The method of claim 41 in which providing a substrate comprises providing a substrate made of a material having a melting point not higher than 550° C., and heating the substrate comprises heating the substrate to a temperature in a range from 500 to 550° C., but not more than the melting point of the substrate material, during deposition of the nitride on the substrate.

63. The method of claim 62 in which the substrate comprises at least one of Al—Ca alloy, Al—Au alloy, or Al—Cu alloy.

64. The method of claim 41 in which providing a substrate comprises providing a substrate made of a material having a melting point not higher than 600° C., and heating the substrate comprises heating the substrate to a temperature in a range from 550 to 600° C., but not more than the melting point of the substrate material, during deposition of the nitride on the substrate.

65. The method of claim 64 in which the substrate comprises soda-lime glass.

66. The method of claim 41 in which depositing the nitride on a substrate comprises forming a thin film of nitride on the substrate.

67. The method of claim 41 in which the second precursor comprises gallium, and the nitride comprises gallium nitride (GaN).

68. The method of claim 67 in which the second precursor comprises trimethylgallium (($CH_3)_3Ga$).

69. The method of claim 41 in which the second precursor comprises indium, and the nitride comprises indium nitride (InN).

70. The method of claim 69 in which the second precursor comprises trimethylindium $((CH_3)_3In)$.

71. The method of claim 41 in which the second precursor comprises aluminum, and the nitride comprises aluminum nitride (AlN).

72. The method of claim 71 in which the second precursor comprises trimethylaluminum $((CH_3)_3Al)$.

73. The method of claim 41 in which the second precursor comprises silicon, and the nitride comprises silicon nitride $(Si_3N_4)$.

74. The method of claim 73 in which the second precursor comprises silane $(SiH_4)$.

75. The method of claim 41 in which the second precursor comprises titanium, and the nitride comprises titanium nitride (TiN).

76. The method of claim 75 in which the second precursor comprises titanium tetrachloride $(TiCl_4)$.

77. The method of claim 41 in which the second precursor comprises carbon, and the nitride comprises carbon nitride $(C_3N_4)$.

78. The method of claim 77 in which the second precursor comprises hydrocarbons.

79. The method of claim 78 in which the hydrocarbons comprise at least one of ethylene or methane.

80. The method of claim 41 in which applying a laser to resonantly excite molecules of the first precursor comprises applying a laser to resonantly excite molecules of ammonia $(NH_3)$.

81. The method of claim 80 in which applying a laser comprises applying a laser having a wavelength of 9.219 μm to resonantly excite the $NH_3$ molecules.

82. The method of claim 41 in which applying a laser comprises projecting a laser along a path parallel to a surface of the substrate.

83. The method of claim 82 in which a distance between the path and the substrate is less than 30 mm.

84. The method of claim 41, comprising expanding a laser beam to form a wide laser beam, and in which applying a laser comprises projecting the wide laser beam along a path parallel to a surface of the substrate.

85. The method of claim 41, comprising applying a second laser to resonantly excite molecules of a third precursor to produce at least one of nitrogen or nitrogen-associated species.

86. The method of claim 85 in which the second laser has a wavelength that is selected to match at least one of a vibrational mode or a vibrational-rotational mode of molecules of the third precursor.

87. The method of claim 85 in which the first and second lasers are applied concurrently, and the wavelength of the first laser is different from the wavelength of the second laser.

88. The method of claim 41, comprising applying a second laser to resonantly excite molecules of the second precursor to produce the component that reacts with at least one of the nitrogen or nitrogen-associated species to form the nitride.

89. The method of claim 88 in which the second laser has a wavelength that is selected to match at least one of a vibrational mode or a vibrational-rotational mode of molecules of the second precursor.

90. The method of claim 88 in which the first and second lasers are applied concurrently, and the wavelength of the first laser is different from the wavelength of the second laser.

91. A method comprising:
applying a first laser to resonantly excite molecules of a first precursor to produce at least one of nitrogen or nitrogen-associated species, in which applying a laser comprises projecting a laser along a path parallel to a surface of the substrate, and a distance between the path and the substrate is approximately 20 mm;
providing a second precursor having a component that reacts with at least one of the nitrogen or the nitrogen-associated species to form a nitride; and
depositing the nitride on a substrate.

* * * * *